(12) United States Patent
Oura et al.

(10) Patent No.: US 10,128,233 B2
(45) Date of Patent: Nov. 13, 2018

(54) SEMICONDUCTOR DEVICE AND SEMICONDUCTOR DEVICE MANUFACTURING METHOD

(71) Applicant: Synaptics Japan GK, Tokyo (JP)

(72) Inventors: Masashi Oura, Tokyo (JP); Yasuhiro Fujii, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/241,448

(22) Filed: Aug. 19, 2016

(65) Prior Publication Data

US 2017/0053911 A1  Feb. 23, 2017

(30) Foreign Application Priority Data

Aug. 21, 2015 (JP) .................. 2015-163802

(51) Int. Cl.
*H01L 29/66* (2006.01)
*H01L 27/088* (2006.01)
*H01L 21/8234* (2006.01)

(52) U.S. Cl.
CPC ........ *H01L 27/088* (2013.01); *H01L 21/8234* (2013.01); *H01L 29/66545* (2013.01)

(58) Field of Classification Search
CPC ................................................ H01L 29/42364
USPC .......................................... 257/501; 438/926
See application file for complete search history.

(56) References Cited

U.S. PATENT DOCUMENTS

| 6,291,870 | B1 * | 9/2001 | Kawashima | ...... H01L 21/76229 |
| | | | | 257/510 |
| 6,693,315 | B2 * | 2/2004 | Kuroda | ............ H01L 21/31053 |
| | | | | 257/288 |
| 7,084,035 | B2 * | 8/2006 | Ueda | ................ H01L 21/82345 |
| | | | | 257/E21.623 |
| 7,393,737 | B2 * | 7/2008 | Yoshizumi | ...... H01L 21/823462 |
| | | | | 257/E21.244 |
| 8,350,354 | B2 * | 1/2013 | Lee | ................ H01L 21/823807 |
| | | | | 257/501 |

* cited by examiner

*Primary Examiner* — Chandra Chaudhari
(74) *Attorney, Agent, or Firm* — Patterson + Sheridan, LLP

(57) ABSTRACT

A semiconductor device includes a first structure component comprising a first transistor, a first dummy pattern, a second structure component comprising a second transistor and a second dummy pattern. The first structure component and the first dummy pattern have a first height, and the second structure component and the second dummy pattern have a second height lower than the first height.

21 Claims, 28 Drawing Sheets

10: SEMICONDUCTOR SUBSTRATE

10: SEMICONDUCTOR SUBSTRATE

10: SEMICONDUCTOR SUBSTRATE

21: LV DIELECTRIC FILM   23: HV DIELECTRIC FILM
22: MV DIELECTRIC FILM

10: SEMICONDUCTOR SUBSTRATE

10: SEMICONDUCTOR SUBSTRATE

23: HV DIELECTRIC FILM

10: SEMICONDUCTOR SUBSTRATE

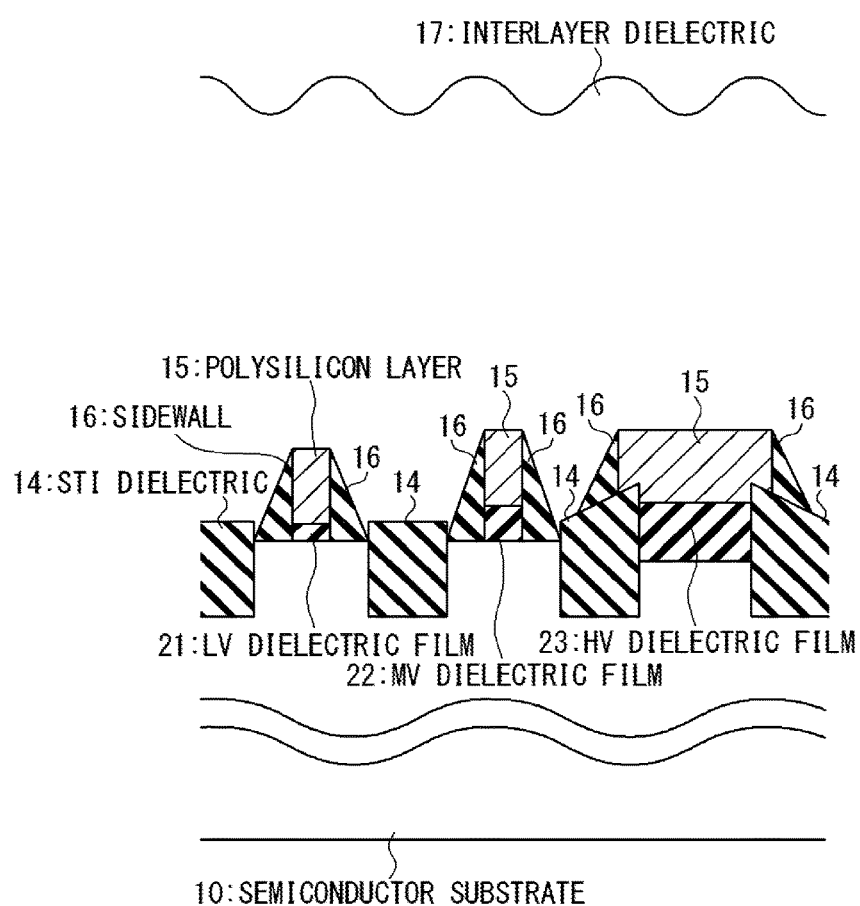

SEMICONDUCTOR DEVICE AND SEMICONDUCTOR DEVICE MANUFACTURING METHOD

CROSS REFERENCE

This application claims priority to Japanese Patent Application No. 2015-163802, filed on Aug. 21, 2015, the disclosure of which is incorporated herein by reference.

TECHNICAL FIELD

The present disclosure relates to a semiconductor device and a method for manufacturing the same, suitably applied to a semiconductor device incorporating multiple types of structure components having different heights and a method for manufacturing the same.

BACKGROUND

The recent enhancement of the resolution of the semiconductor device manufacturing process is accompanied by significant influences of film thickness variations. One known cause of film thickness variations is the nature of the CMP (chemical mechanical polishing) process, such as the polishing time and the polishing pressure. Another known cause is an uneven surface structure against which a film deposition or a CMP process is to be performed, due to multiple structure components with different gate dielectric thicknesses placed in the same shot. Still another known cause of film thickness variations is an influence of dishing and erosion, which may occur depending on the layout pattern density.

One known technique for reducing film thickness variations is to place CMP dummy patterns over the wafer. As to CMP dummy pattern placement, the following two techniques are known: A first known technique is to place dummy patterns depending on the data ratios of respective regions in each shot. A second known technique is to place dummy patterns in the peripheral region of the wafer. These techniques aim at improving the flatness of the wafer surface by making the CMP pressure uniform over the wafer with dummy patterns of the same height.

In the above-described techniques, however, surface irregularity generated by film deposition of an oxide film or the like is not taken into account. In a region in which multiple structure components with different heights are placed, surface irregularity is generated depending on the heights and density of the structure components; however, the above-described techniques do not address this issue.

In connection with the above, Japanese Patent Application Publication No. 2002-198419A discloses a manufacturing and designing method of semiconductor devices. In the technique disclosed in this patent document, a film to be processed with a CMP process is formed to cover a semiconductor substrate in which dummy patterns separated by trench isolations are placed in isolation regions. This is followed by planarization with the CMP process. This technique effectively reduces dishing and erosion and achieves improved surface flatness. In this technique, the planar sizes of the dummy patterns and the widths of the trenches are determined on the basis of the ratio of the sum of the planar sizes of the protruding portions of the film to be processed with the CMP process to the overall area size in the peripheral region (the occupation density of the film to be processed with the CMP process in the peripheral region).

SUMMARY OF DISCLOSURE

Accordingly, an objective of the present disclosure is to improve the film flatness of a CMP process. Other objectives and new features would be understood from the disclosure of the specification and attached figures.

In one embodiment, a plurality of dummy patterns having different heights is properly placed to improve the film flatness.

This effectively improves the film flatness of a CMP process.

BRIEF DESCRIPTION OF THE DRAWINGS

The above and other advantages and features of the present disclosure will be more apparent from the following description taken in conjunction with the accompanied drawings, in which:

FIG. 71J is a section view illustrating the state before a CMP process is performed;

DETAILED DESCRIPTION OF EMBODIMENTS

Those skilled in the art would recognize that many alternative embodiments can be accomplished using the teachings of the present disclosure and that the disclosure is not limited to the embodiments illustrated for explanatory purposed.

Various embodiments will be now described herein with reference to attached drawings.

In one embodiment, in a semiconductor device incorporating a structure component comprising a transistor, a dummy pattern is formed to improve the film flatness of a CMP process. This structure component may be the transistor itself or a gate dielectric film included by the transistor. The dummy pattern may be formed with a structure corresponding to the whole of the transistor or with a structure corresponding to the gate dielectric film.

Figure 1:
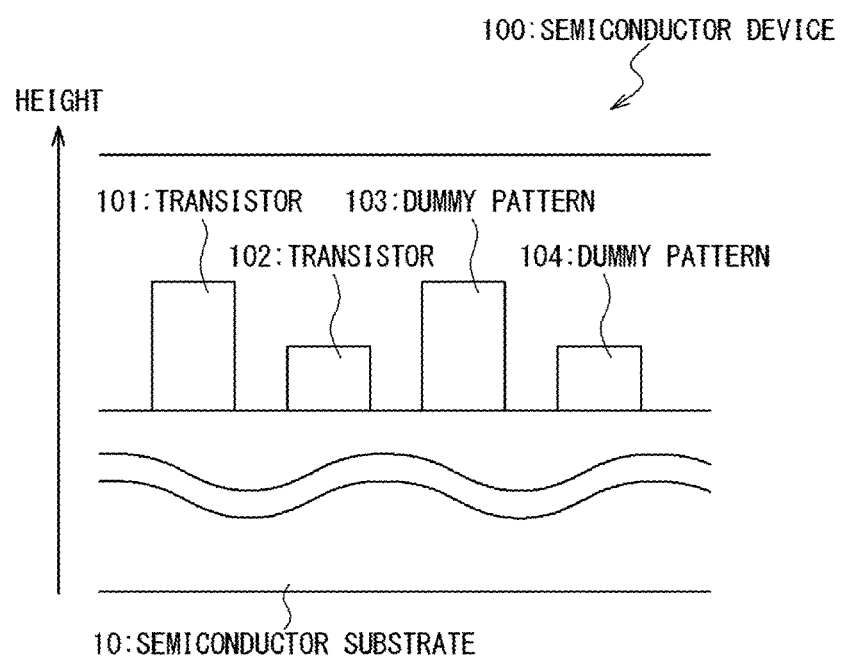
FIG. 1 is a section view illustrating an exemplary structure of a semiconductor device in one embodiment.

FIG. 1 is a section view illustrating an example of the structure of a semiconductor device 100 in one embodiment. The semiconductor device 100 illustrated in FIG. 1 includes a semiconductor substrate 10, a first transistor 101, a second transistor 102, a first dummy pattern 103 and a second dummy pattern 104. The first and second transistors 101 and 102 have different heights. Similarly, the first and second dummy patterns 103 and 104 have different heights. The first transistor 101 and the first dummy pattern 103 have the same height; the first transistor 101 and the first dummy pattern 103 both have a first height. The second transistor 102 and the second dummy pattern 104 have the same height; the second transistor 102 and the second dummy pattern 104 both have a second height. In the example illustrated in FIG. 1, the second height is lower than the first height. It should be noted that the height of each structure component integrated in the semiconductor device 100 is defined as the position of the top surface of each structure component in the thickness direction of the semiconductor substrate 10. As for a transistor, the height of the transistor may be defined as the position of the top surface of the gate electrode.

In this embodiment, multiple types of structure components having different heights are integrated on the semiconductor substrate 10 and multiple types of dummy patterns having heights corresponding to the respective types of structure components are also integrated on the semiconductor substrate 10. In this embodiment, the film flatness of a CMP process is effectively improved by placing the dummy patterns having different heights depending on the arrangement of the structure components having different heights.

In this embodiment, CMP processes are performed a plurality of times in a semiconductor device manufacturing process. Two of the CMP processes are of interest in this embodiment. The two CMP processes are performed at different steps depending on the semiconductor device manufacturing process. A description is first given of steps in which CMP processes are performed, for three types of semiconductor device manufacturing processes. A dummy pattern arrangement in the first CMP process is then described as a first embodiment, and a dummy pattern arrangement in the second CMP process is then described as a second embodiment.

Embodiments described in the following are directed to semiconductor devices incorporating gate dielectric films having different heights.

As to a liquid crystal display driver, for example, a logic circuit operated on a relatively low voltage about 1.5 V, a liquid crystal driver circuit operated on a relatively high voltage about 30V, and a boosting circuit operated on a middle voltage about 5V under a control by the logic circuit to control the liquid crystal driver circuit are integrated on the same semiconductor substrate.

Preferably, the gate dielectric film of a transistor operated on a low voltage has a thin thickness, the gate dielectric film of a transistor operated on a high voltage has a thick thickness, and the gate dielectric film of a transistor operated on a middle voltage has a middle thickness. It is preferable that the widths and lengths of these gate dielectric films are adjusted depending on the operating voltage.

Hereinafter, a transistor operated on a low voltage is referred to as LV (low voltage) transistor and the gate dielectric film thereof is referred to as LV gate dielectric film. Correspondingly, a transistor operated on a high voltage is referred to as HV (high voltage) transistor and the gate dielectric film thereof is referred to as HV gate dielectric film. Finally, a transistor operated on a middle voltage is referred to as MV (middle voltage) transistor and the gate dielectric film thereof is referred to as MV gate dielectric film.

Also, a dummy dielectric film formed at the same time as LV gate dielectric films and having the same height as the LV gate dielectric films is referred to as LV dummy dielectric film and a dummy pattern corresponding to an LV transistor and including the LV dummy dielectric film is referred to as LV dummy pattern. Correspondingly, a dummy dielectric film formed at the same time as MV gate dielectric films and having the same height as the MV gate dielectric films is referred to as MV dummy dielectric film and a dummy pattern corresponding to an MV transistor and including the MV dummy dielectric film is referred to as MV dummy pattern. Finally, a dummy dielectric film formed at the same time as HV gate dielectric films and having the same height as the HV gate dielectric films is referred to as HV dummy dielectric film and a dummy pattern corresponding to an HV transistor and including the HV dummy dielectric film is referred to as HV dummy pattern.

Furthermore, LV gate dielectric films and LV dummy dielectric films are collectively referred to as LV dielectric films, MV gate dielectric films and MV dummy dielectric films are collectively referred to as MV dielectric films, and HV gate dielectric films and HV dummy dielectric films are collectively referred to as HV dielectric films.

In the following, three semiconductor device manufacturing processes are described, in which semiconductor devices incorporating gate dielectric films having different heights are manufactured. A first semiconductor device manufacturing process, which will be first described in the following, is a standard process. Second and third semiconductor device manufacturing processes, which will be then described, are based on a delayed STI (shallow trench isolation) formation technique. A major difference of the second and third semiconductor device manufacturing processes from the first semiconductor device manufacturing process is that the order of the dummy dielectric film formation process and the STI formation process is switched.

Figure 2:
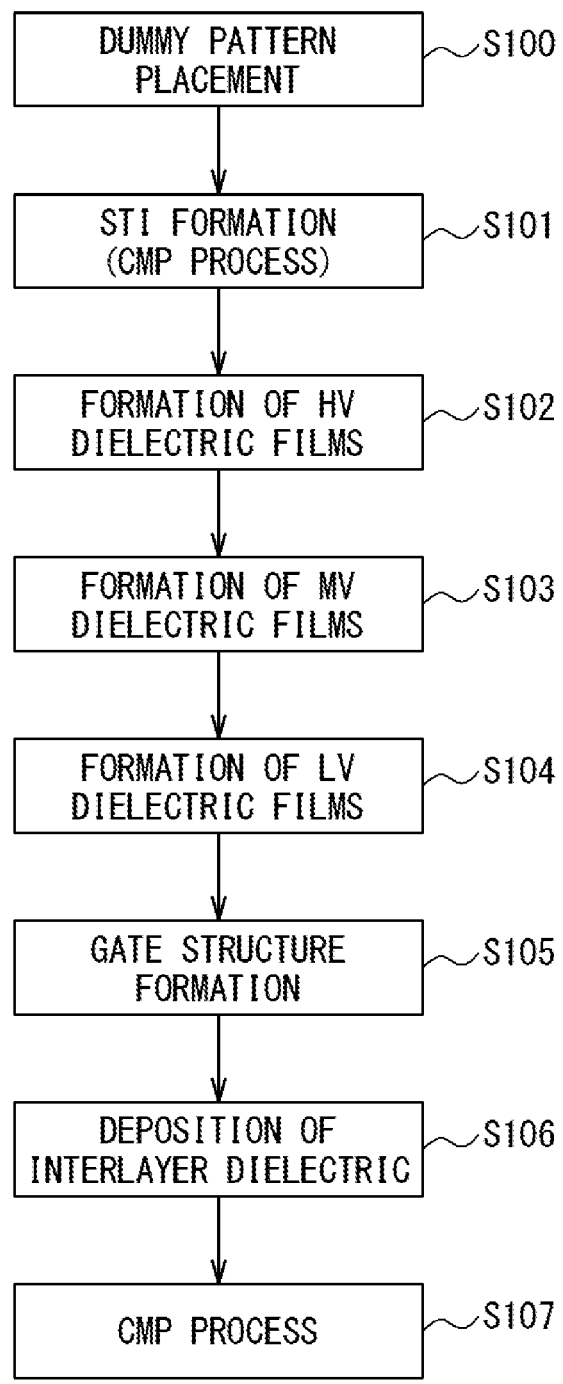
FIG. 2 is a flowchart illustrating an exemplary procedure of a first semiconductor device manufacturing process in one embodiment.

First, a description is given of the first semiconductor device manufacturing process. FIG. 2 is a flowchart illustrating an exemplary procedure of the first semiconductor device manufacturing process in this embodiment. The procedure illustrated in FIG. 2 includes steps S100 to S107. The states of the semiconductor substrate at the respective steps of the procedure illustrated in FIG. 2 are illustrated in FIGS. 3A to 3I.

At step S100, the arrangement of dummy patterns is determined in the placement, as a preparation for starting manufacturing the semiconductor device 100.

Figure 3A:
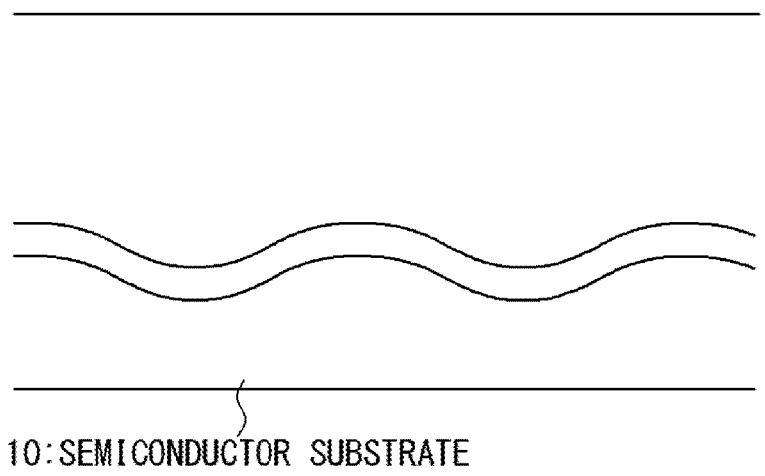
FIG. 3A is a section view illustrating the initial state of a semiconductor substrate.
Figure 3B:
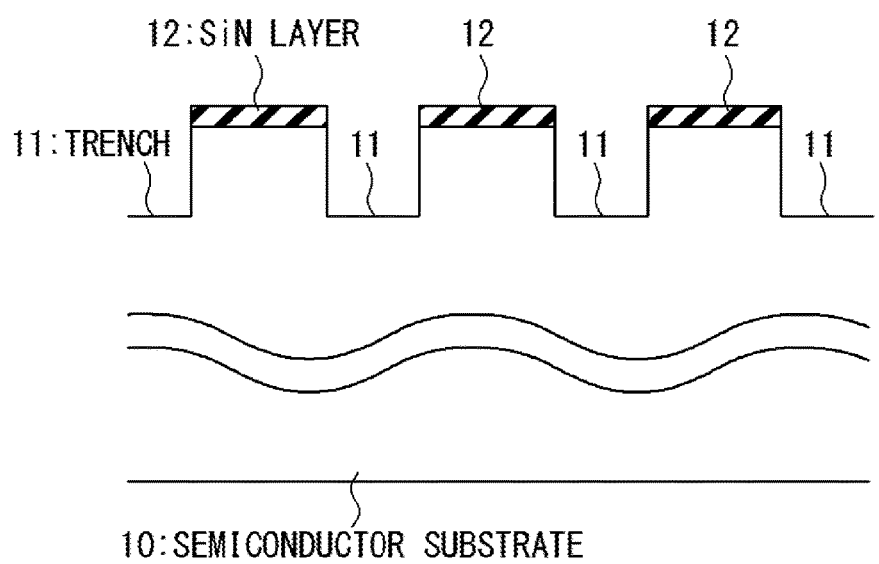
FIG. 3B is a section view illustrating the state after shallow trench isolation (STI) trenches are formed.

FIG. 3A is a section view illustrating the initial state of the semiconductor substrate 10. In this state, the main surface of the semiconductor substrate 10 is flat. At step S101, an STI (shallow trench isolation) structure is formed. Specifically, STI trenches 11 and SiN (silicon nitride) layers 12 are formed so that the SiN layers 12 cover the main surface of the semiconductor substrate 10 other than the trenches 11. FIG. 3B is a section view illustrating the state in which the STI trenches 11 are formed.

Figure 3C:
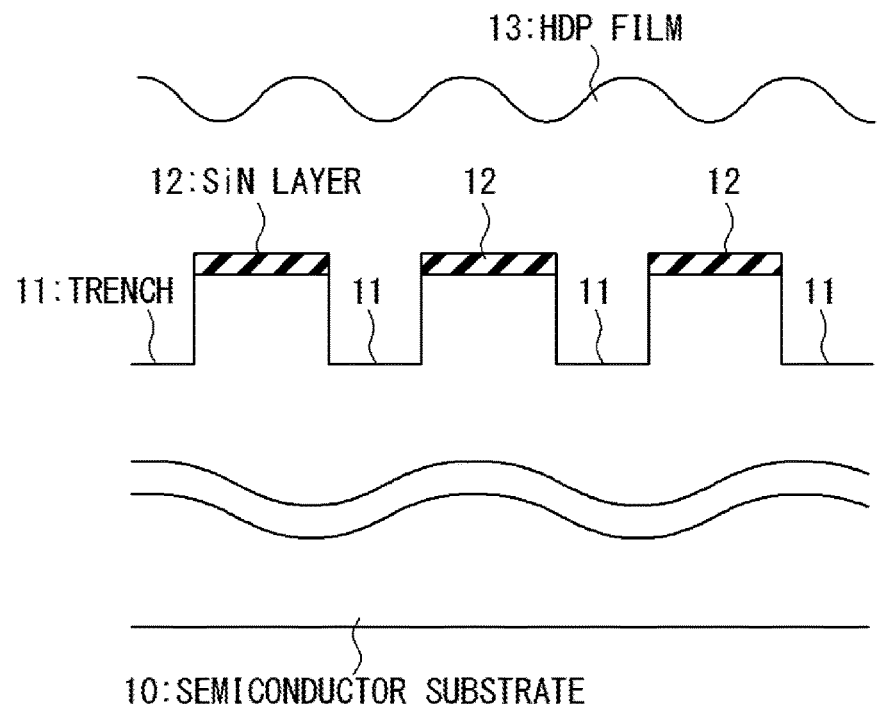
FIG. 3C is a section view illustrating the state before a CMP process is performed.
Figure 3D:
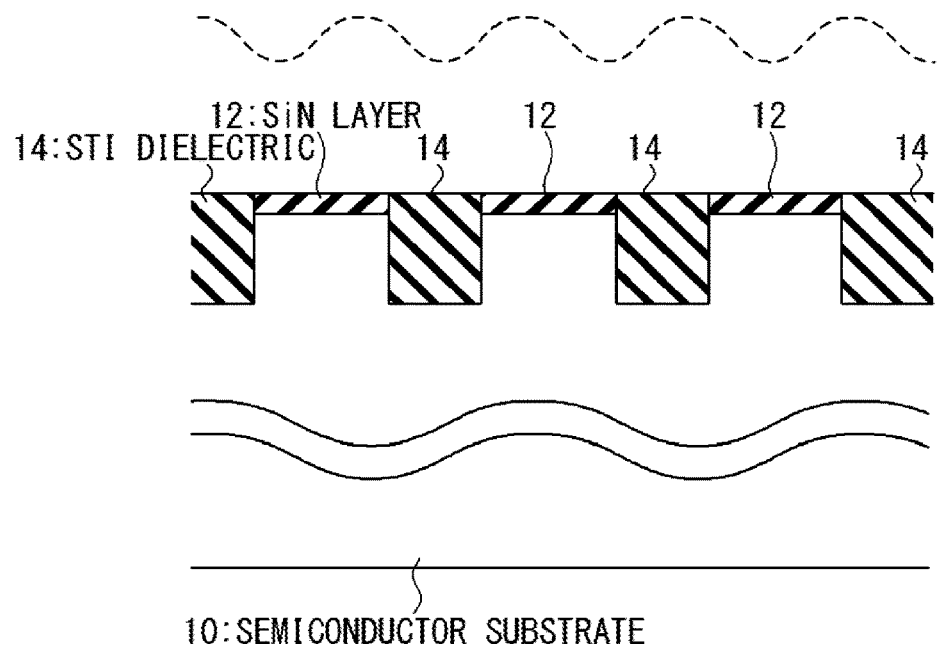
FIG. 3D is a section view illustrating the state after a CMP process is performed.

After an HDP film 13 is then formed to cover the whole of the main surface of the semiconductor substrate 10 through an HDP (high-density plasma) process, a CMP process is performed to form STI dielectrics 14. FIG. 3C is a section view illustrating the state of the semiconductor substrate 10 before the CMP process and FIG. 3D is a section view illustrating the state after the CMP process. In the CMP process at step S101, the SiN layers 12 are used as stopper films and the semiconductor substrate 10 is polished until the top surfaces of the SiN layers 12 are exposed.

Figure 3E:
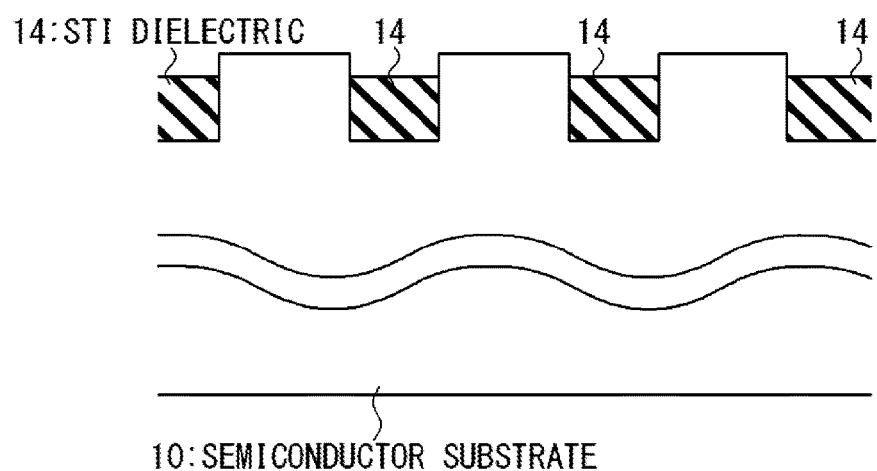
FIG. 3E is a section view illustrating the state after silicon nitride (SiN) layers are removed.

This is followed by removing the SiN layers 12. FIG. 3E is a section view illustrating the state after the SiN layers 12 are removed.

Figure 3F:
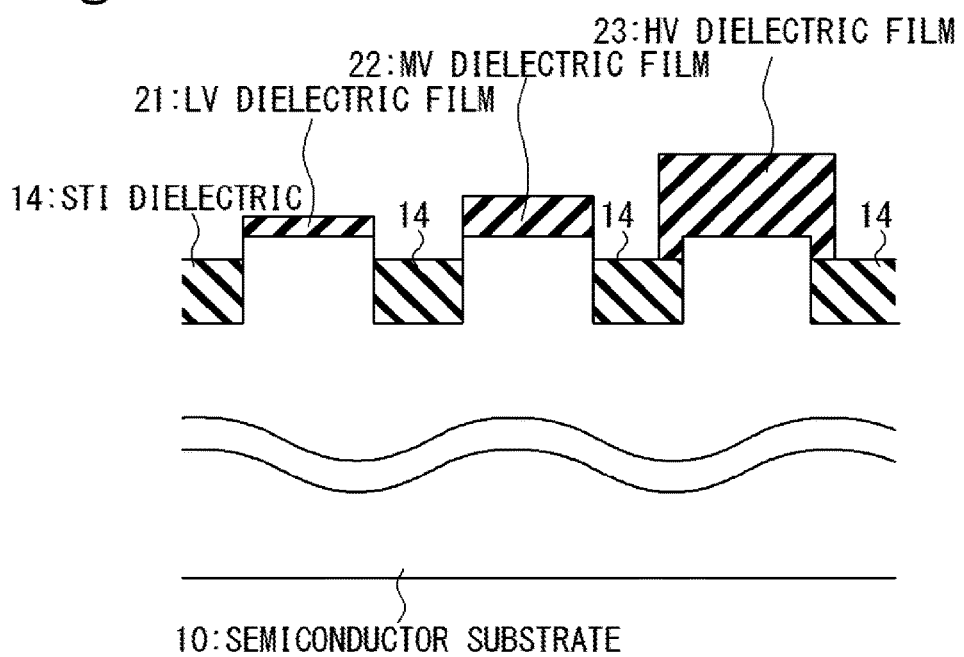
FIG. 3F is a section view illustrating the state after low voltage (LV) dielectric films, middle voltage (MV) dielectric films and high voltage (HV) dielectric films are formed.

Subsequently, HV dielectric films 23 (one illustrated) are formed at step S102, MV dielectric films (one illustrated) are formed at step S103, and LV dielectric films 21 (one illustrated) are formed at step S104. It should be noted that, at step S102, HV gate dielectric films 33 and HV dummy dielectric films 43, which are collectively referred to as HV dielectric films 23, are formed at the same time. Similarly, MV gate dielectric films 32 and MV dummy dielectric films 42, which are collectively referred to as MV dielectric films 22, are formed at the same time at step S103, and LV gate dielectric films 31 and LV dummy dielectric films 41, which are collectively referred to as LV dielectric films 21, are formed at the same time at step S104. FIG. 3F is a section view illustrating the state of the semiconductor substrate 10 after the LV dielectric films 21, MP dielectric films 22 and HV dielectric films 23 are formed.

Figure 3G:
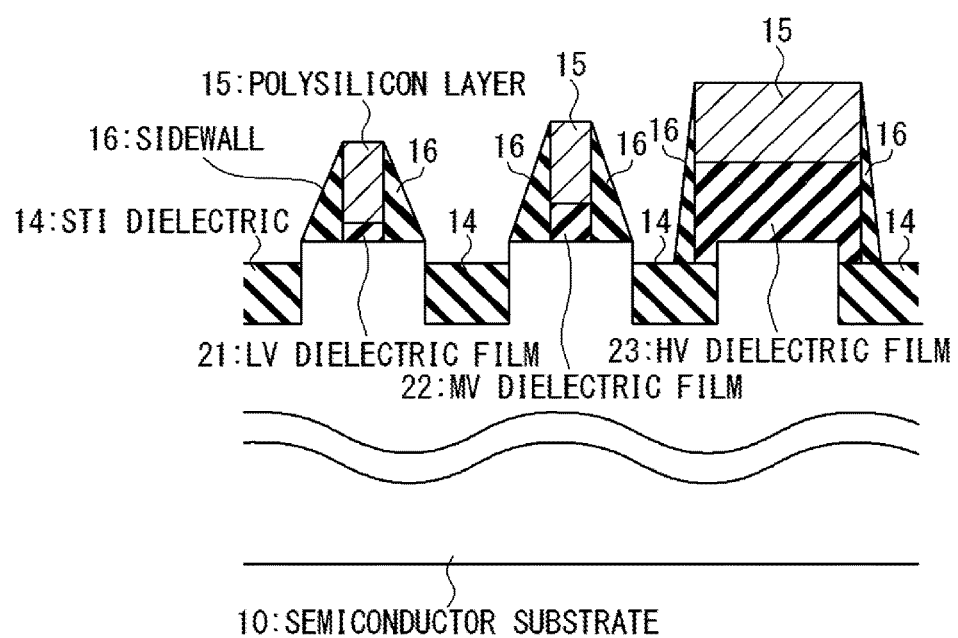
FIG. 3G is a section view illustrating the state after polysilicon layers and sidewalls are formed.

Subsequently, gate structures are formed at step S105. The gate structures include polysilicon layers 15 and sidewalls 16 which surround the polysilicon layers 15. The polysilicon layers 15 are formed on the LV dielectric films 21, MV dielectric films 22 and HV dielectric films 23, which are used as gate dielectrics. FIG. 3G is a section diagram illustrating the state of the semiconductor substrate 10 after the polysilicon layers 15 and the sidewalls 16 are formed.

Figure 3H:
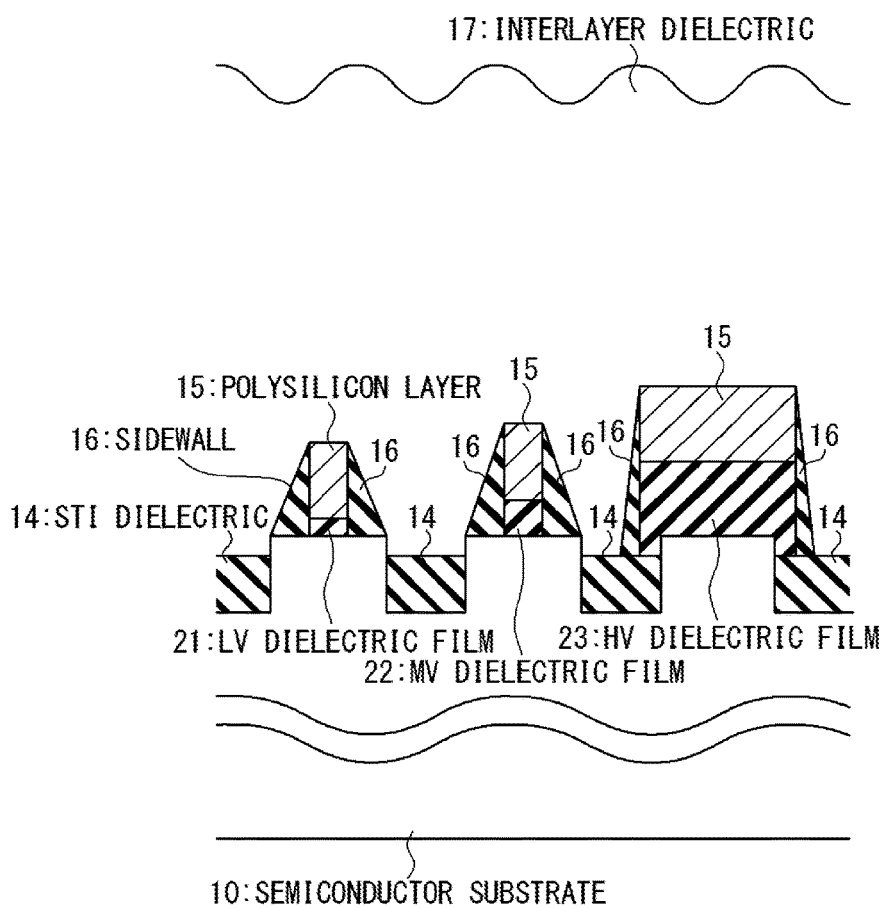
FIG. 3H is a section view illustrating the state after an interlayer dielectric is formed.

At step S106, an interlayer dielectric 17 is then deposited to cover the whole of the main surface of the semiconductor substrate 10. FIG. 3H is a section view illustrating the state of the semiconductor substrate 10 after the deposition of the interlayer dielectric 17.

Figure 3I:
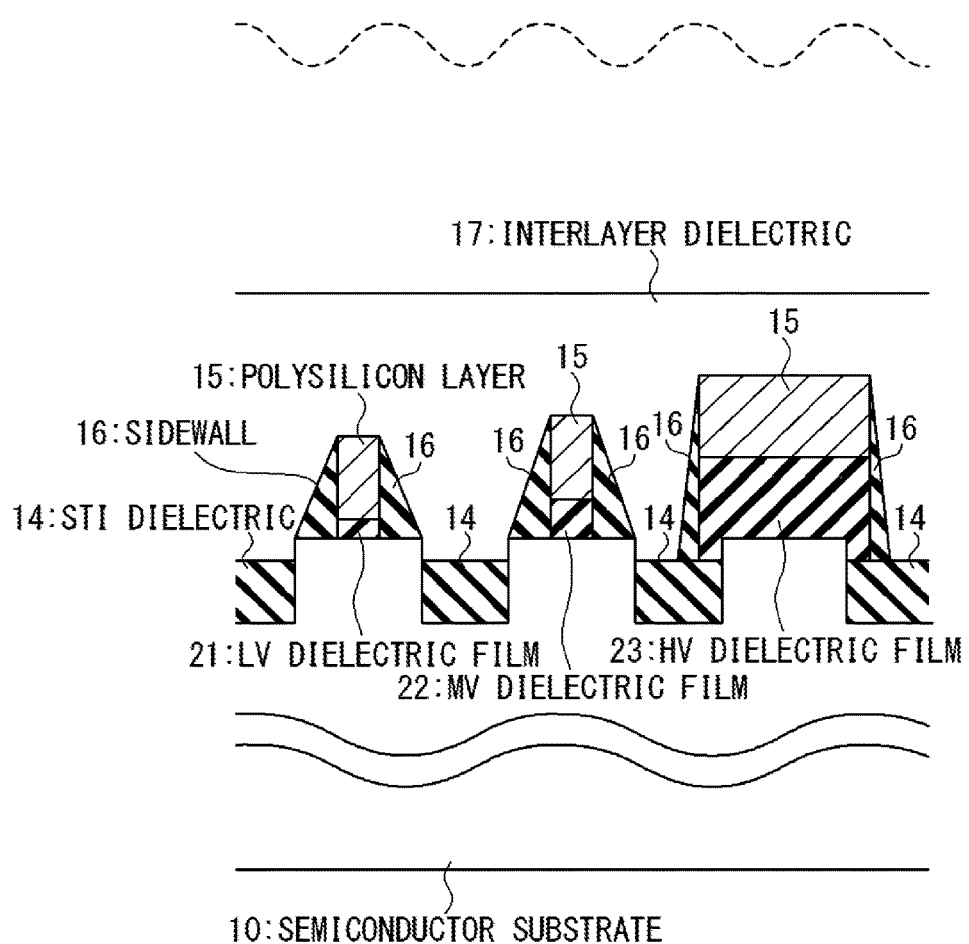
FIG. 3I is a section view illustrating the state after a CMP process is performed after the formation of the interlayer dielectric.

This is followed by performing a CMP process at step S107. FIG. 3I is a section view illustrating the state of the semiconductor substrate 10 after the CMP process is performed against the interlayer dielectric 17.

Figure 4:
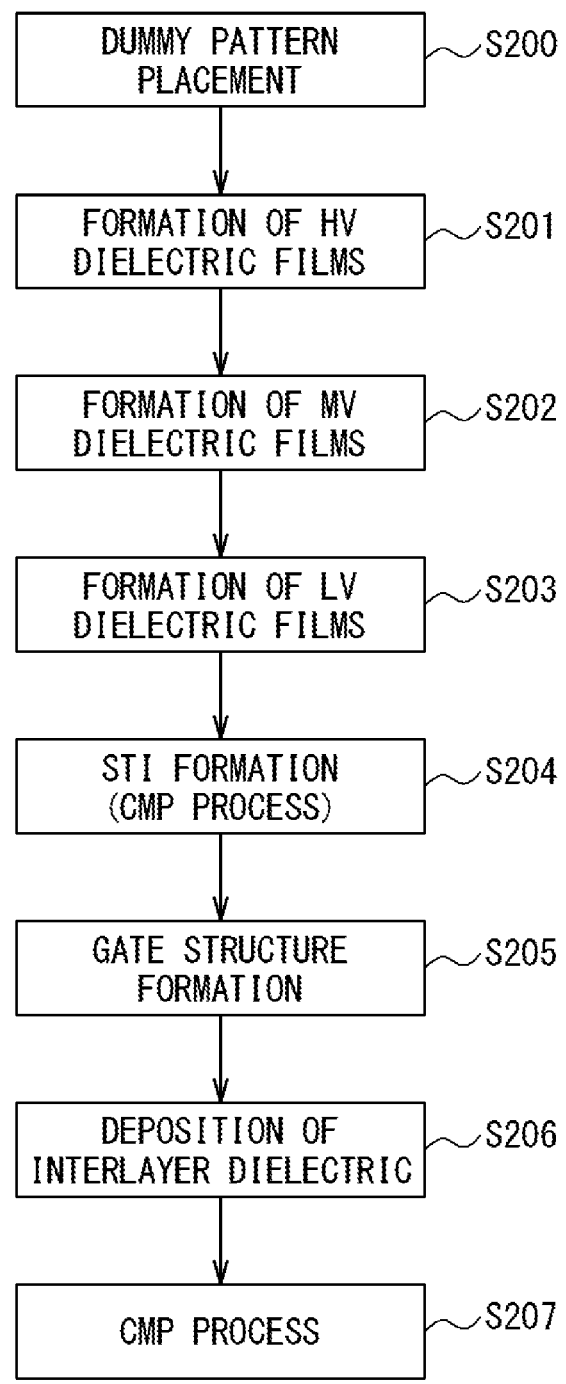
FIG. 4 is a flowchart illustrating an exemplary procedure of a second semiconductor device manufacturing process in one embodiment.

A description is then given of the second semiconductor device manufacturing process. FIG. 4 is a flowchart illustrating an exemplary procedure of the second semiconductor device manufacturing process in this embodiment. The procedure illustrated in FIG. 4 includes steps S200 to S207. The states of the semiconductor substrate at the respective steps of the procedure illustrated in FIG. 4 are illustrated in FIGS. 5A to 5I.

At step S200, the arrangement of dummy patterns is determined in the placement, as a preparation for starting manufacturing the semiconductor device 100.

Figure 5A:
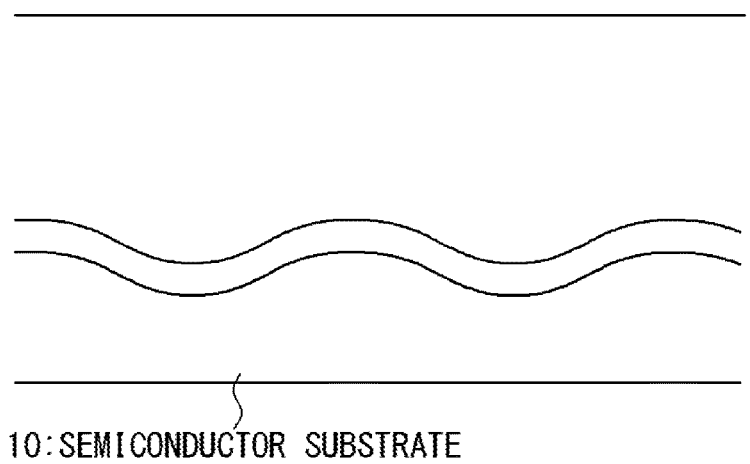
FIG. 5A is a section view illustrating the initial state of a semiconductor substrate.

FIG. 5A is a section view illustrating the initial state of the semiconductor substrate 10. In this state, the main surface of the semiconductor substrate 10 is flat.

Figure 5B:
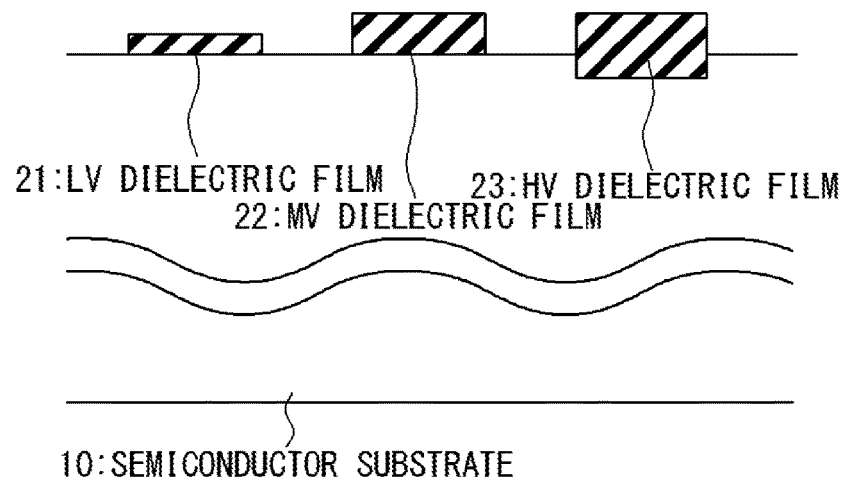
FIG. 5B is a section view illustrating the state after LV dielectric films, MV dielectric films and HV dielectric films are formed.

Subsequently, HV dielectric films 23 (one illustrated) are formed at step S201, MV dielectric films (one illustrated) are formed at step S202 and LV dielectric films 21 (one illustrated) are formed at step S203. It should be noted that, at step S201, HV gate dielectric films 33 and HV dummy dielectric films 43, which are collectively referred to as HV dielectric films 23, are formed at the same time. Similarly, MV gate dielectric films 32 and MV dummy dielectric films 42, which are collectively referred to as MV dielectric films 22, are formed at the same time at step S202, and LV gate dielectric films 31 and LV dummy dielectric films 41, which are collectively referred to as LV dielectric films 21, are formed at the same time at step S203. FIG. 5B is a section view illustrating the state of the semiconductor substrate 10 after the LV dielectric films 21, MP dielectric films 22 and HV dielectric films 23 are formed. It should be noted that, to reduce the differences between the heights of the respective top surfaces of the LV dielectric films 21, the MV dielectric films 22 and the HV dielectric films 23 as small as possible, The bottom surfaces of the LV dielectric films 21 and MV dielectric films 22 are aligned with the main surface of the semiconductor substrate 10 while the bottom surfaces of the HV dielectric films 23 are positioned below the main surface of the semiconductor substrate 10.

Figure 5C:
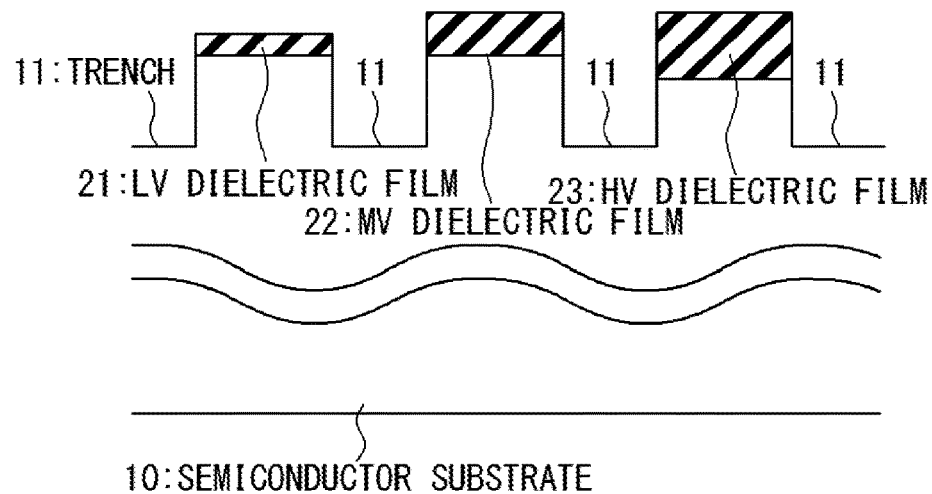
FIG. 5C is a section view illustrating the state after STI trenches are formed.

This is followed by forming an STI structure at step S204. Specifically, STI trenches 11 are first formed. FIG. 5C is a section view illustrating the state in which the STI trenches 11 are formed. The trenches 11 are formed around the LV dielectric films 21, MV dielectric films 22 and HV dielectric films 23.

Figure 5D:
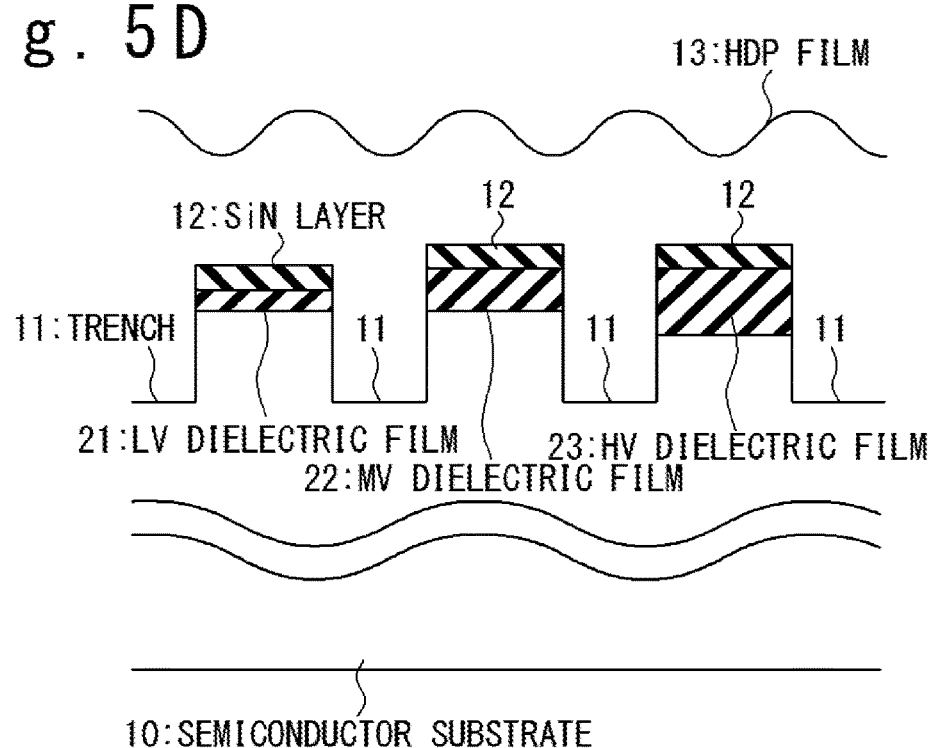
FIG. 5D is a section view illustrating the state before a CMP process is performed.
Figure 5E:
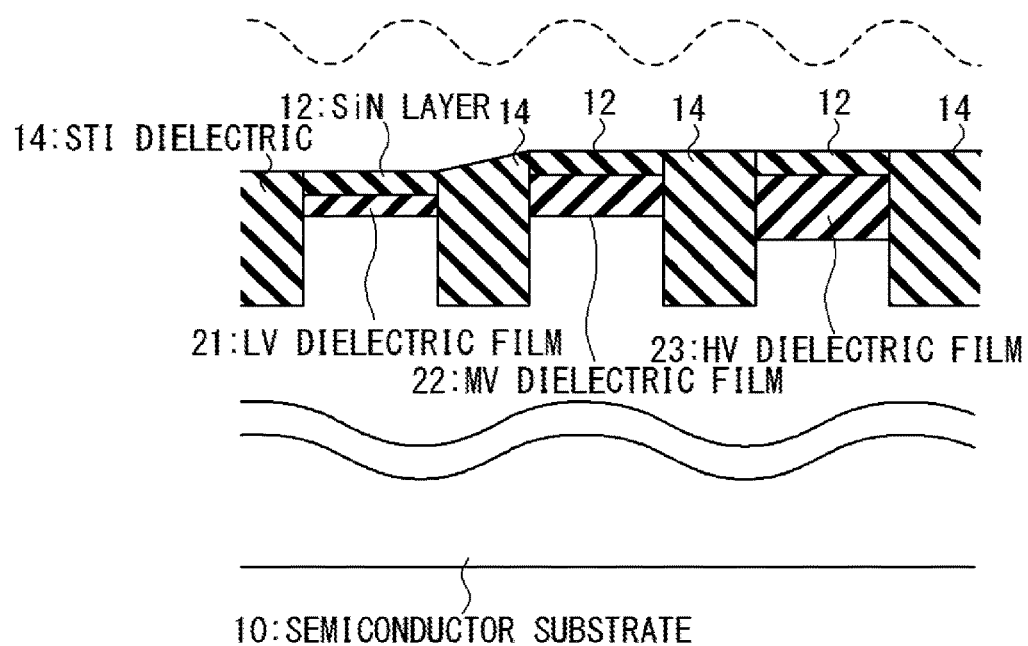
FIG. 5E is a section view illustrating the state after a CMP process is performed.

SiN layers 12 are then formed on the top surfaces of the LV dielectric films 21, MV dielectric films 22 and HV dielectric films 23. After an HDP film 13 is then formed to cover the whole of the main surface of the semiconductor substrate 10 through an HDP (high-density plasma) process, a CMP process is performed against the HDP film 13 to form STI dielectrics 14. FIG. 5D is a section view illustrating the state of the semiconductor substrate 10 before the CMP process and FIG. 5E is a section view illustrating the state after the CMP process. In the CMP process at step S205, the SiN layers 12 are used as stopper films and the semiconductor substrate 10 is polished until the top surfaces of the SiN layers 12 are exposed.

Figure 5F:
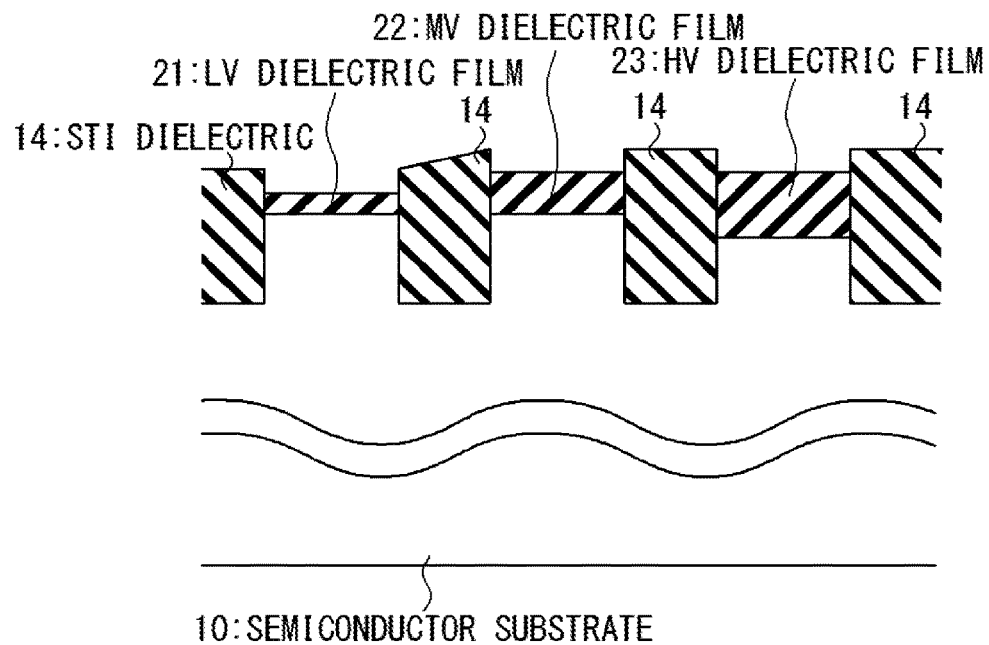
FIG. 5F is a section view illustrating the state after SiN layers are removed.

This is followed by removing the SiN layers 12. FIG. 5F is a section view illustrating the state after the SiN layers 12 are removed.

Figure 5G:
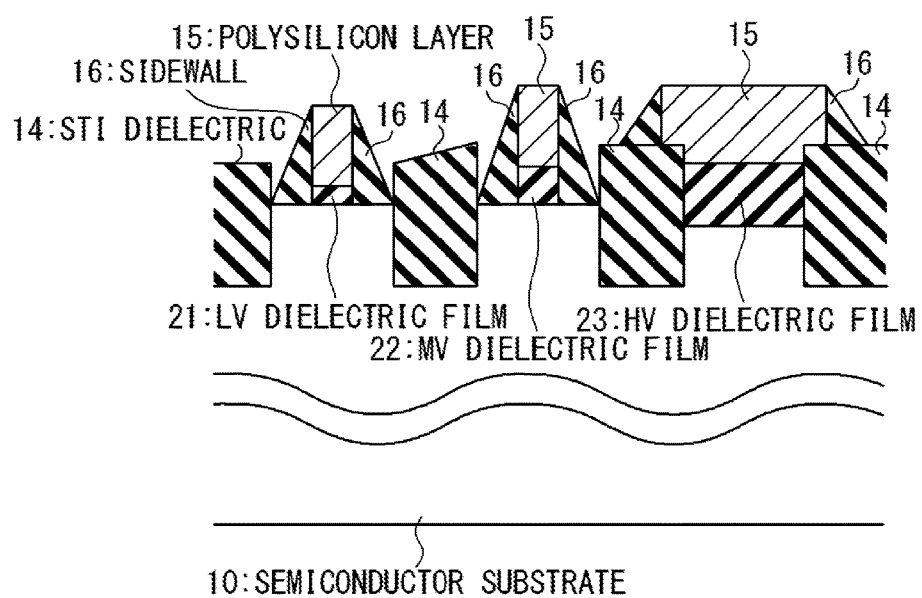
FIG. 5G is a section view illustrating the state after polysilicon layers and sidewalls are formed.

Subsequently, gate structures are formed at step S205. The gate structures include polysilicon layers 15 and sidewalls 16 which surround the polysilicon layers 15. The polysilicon layers 15 are formed on the LV dielectric films 21, MV dielectric films 22 and HV dielectric films 23, which are used as gate dielectrics. FIG. 5G is a section diagram illustrating the state of the semiconductor substrate 10 after the polysilicon layers 15 and the sidewalls 16 are formed.

Figure 5H:
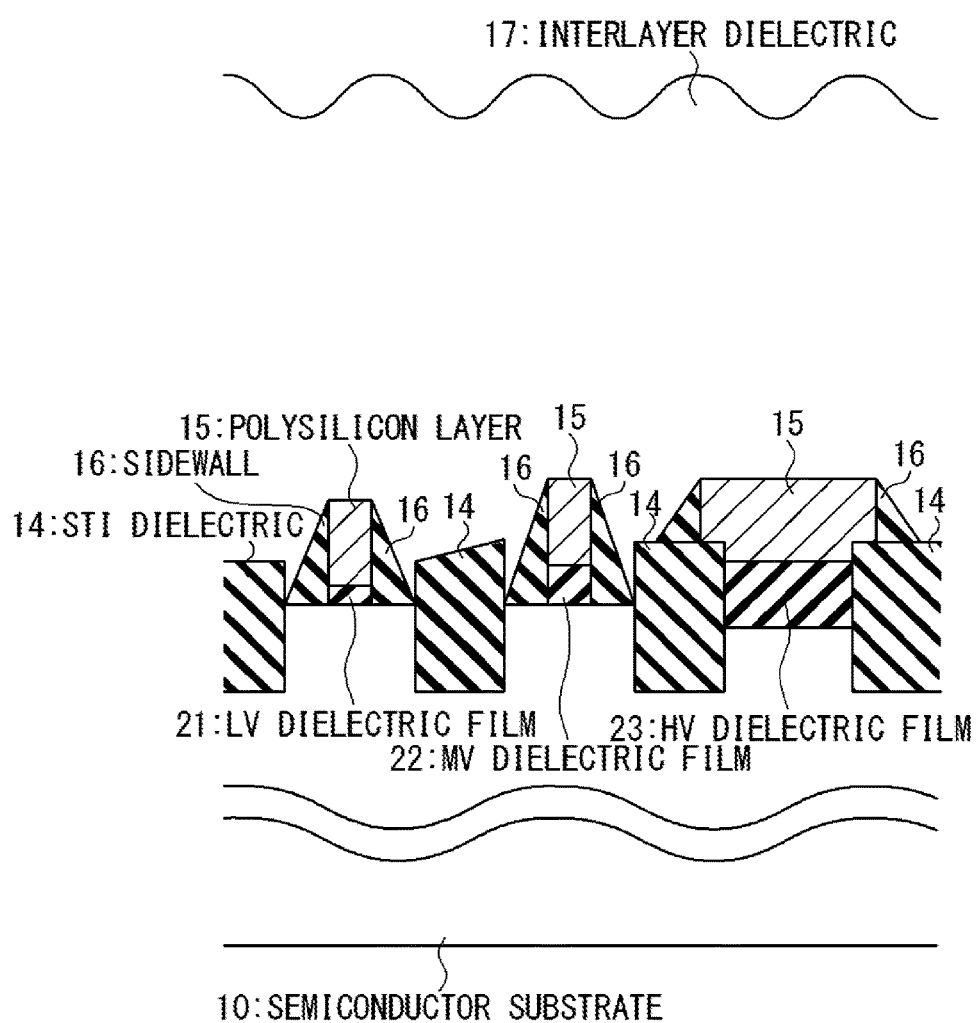
FIG. 5H is a section view a section view illustrating the state after an interlayer dielectric is formed and before a CMP process is performed.

At step S206, an interlayer dielectric 17 is then deposited to cover the whole of the main surface of the semiconductor substrate 10. FIG. 5H is a section view illustrating the state of the semiconductor substrate 10 after the deposition of the interlayer dielectric 17.

Figure 5I:
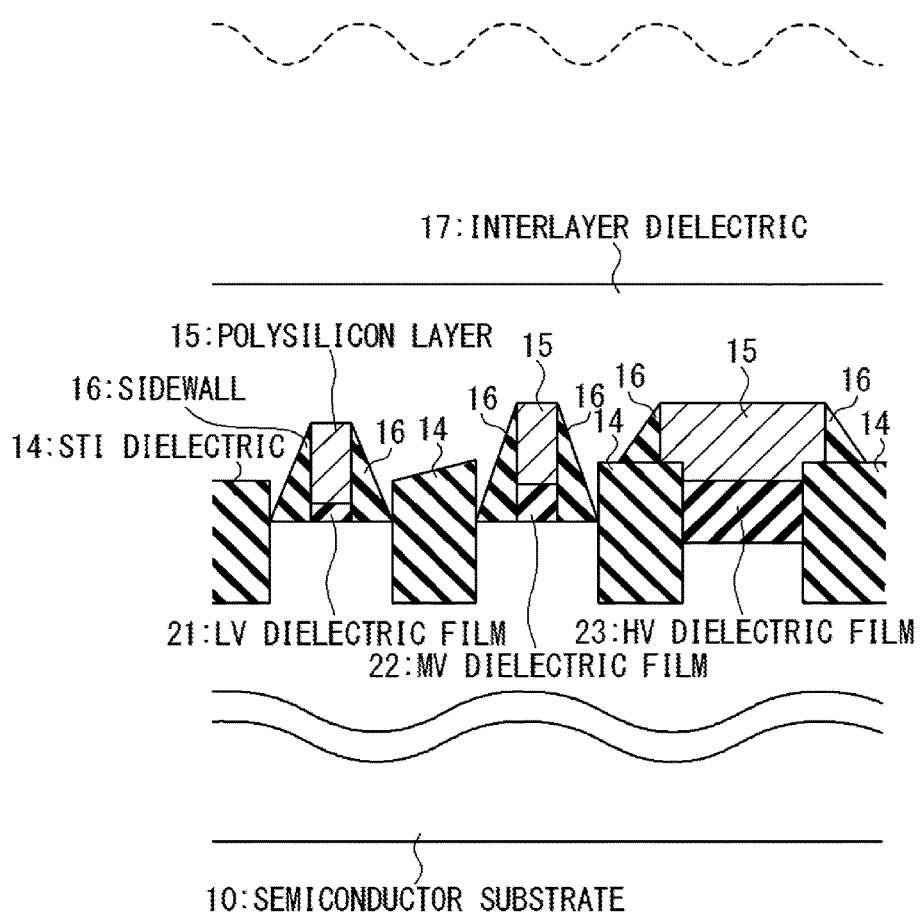
FIG. 5I is a section view illustrating the state after a CMP process is performed after the formation of the interlayer dielectric.

This is followed by performing a CMP process at step S207. FIG. 5I is a section view illustrating the state of the semiconductor substrate 10 after the CMP process is performed against the interlayer dielectric 17.

Figure 6:
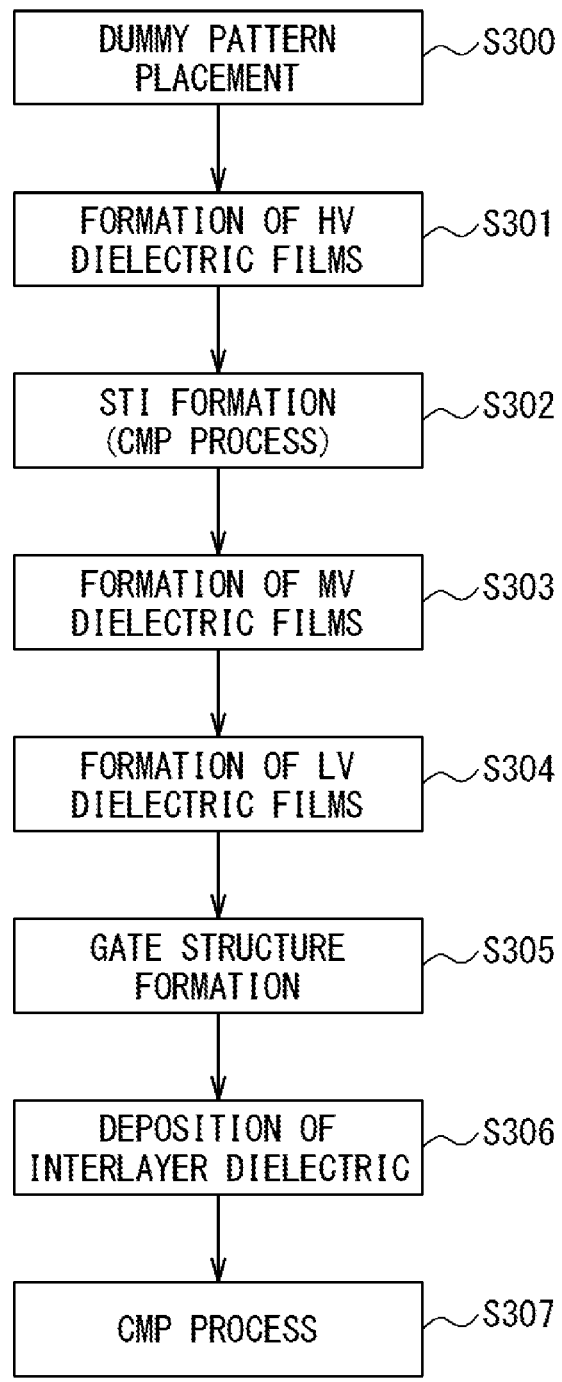
FIG. 6 is a flowchart illustrating an exemplary procedure of a third semiconductor device manufacturing process in one embodiment.

A description is then given of the third semiconductor device manufacturing process. FIG. 6 is a flowchart illustrating an exemplary procedure of the third semiconductor device manufacturing process in this embodiment. The procedure illustrated in FIG. 6 includes steps S300 to S307. The states of the semiconductor substrate at the respective steps of the manufacture process are illustrated in FIGS. 7A to 7J.

At step S300, the arrangement of dummy patterns is determined in the placement, as a preparation for starting manufacturing the semiconductor device 100.

Figure 7A:
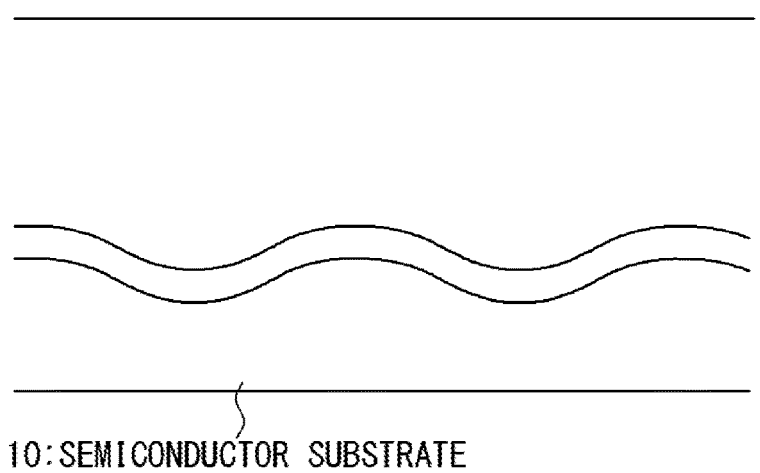
FIG. 7A is a section view illustrating the initial state of a semiconductor substrate.
Figure 7B:
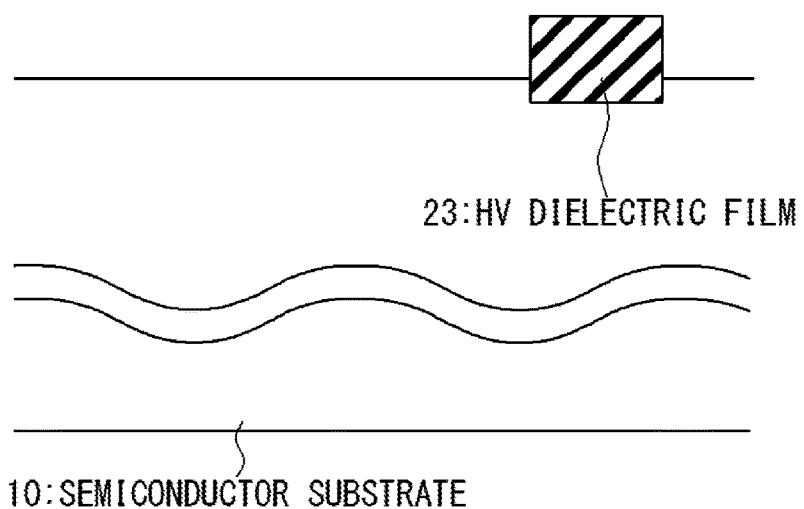
FIG. 7B is a section view illustrating the state after HV dielectric films are formed.

FIG. 7A is a section view illustrating the initial state of the semiconductor substrate 10. In this state, the main surface of the semiconductor substrate 10 is flat. Subsequently, HV dielectric films 23 (one illustrated) are formed at step S301. FIG. 7B is a section view illustrating the state of the semiconductor substrate 10 after the HV dielectric films 23 are formed. The bottom surfaces of the HV dielectric films 23 are positioned below the main surface of the semiconductor substrate 10.

Figure 7C:
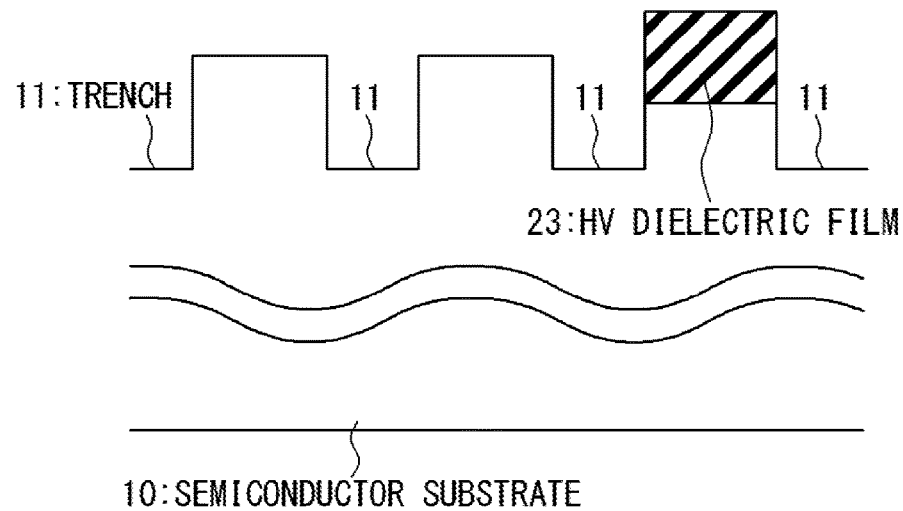
FIG. 7C is a section view illustrating the state after STI trenches are formed.
Figure 7D:
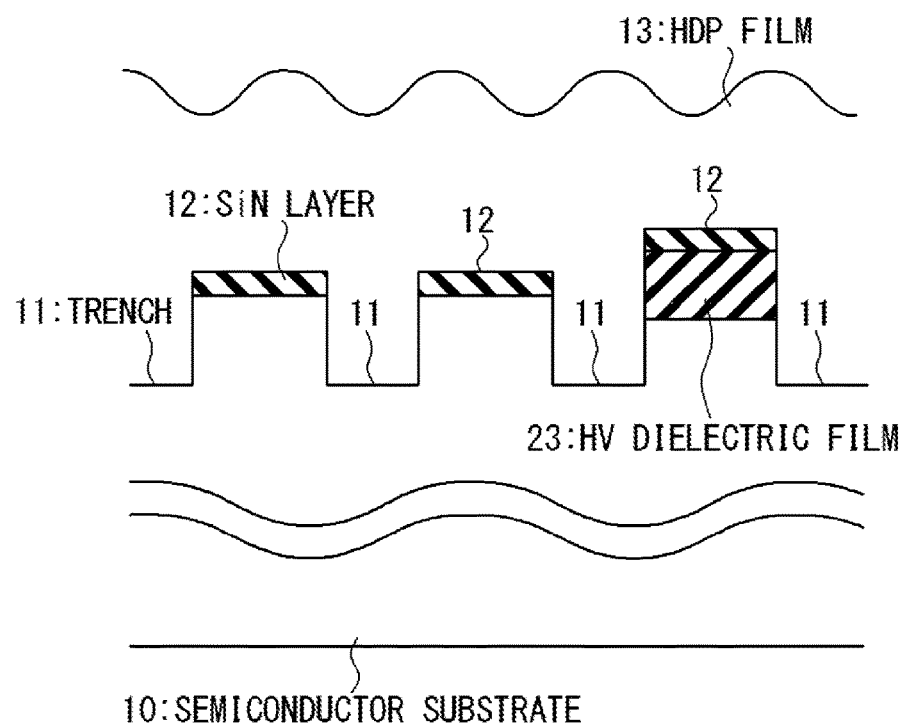
FIG. 7E is a section view illustrating the state after a CMP process is performed.
FIG. 7F is a section view illustrating the state after SiN layers are removed.
FIG. 7G is a section view illustrating the state after LV dielectric films and MV dielectric films are formed.
FIG. 7H is a section view illustrating the state after polysilicon layers and sidewalls are formed.
FIG. 7I is a section view a section view illustrating the state after an interlayer dielectric is formed.
FIG. 7J is a section view illustrating the state after a CMP process is performed after the formation of the interlayer dielectric.

At step S302, an STI structure is formed. Specifically, STI trenches 11 are first formed. FIG. 7C is a section view illustrating the state in which the STI trenches 11 are formed.

Figure 7E:
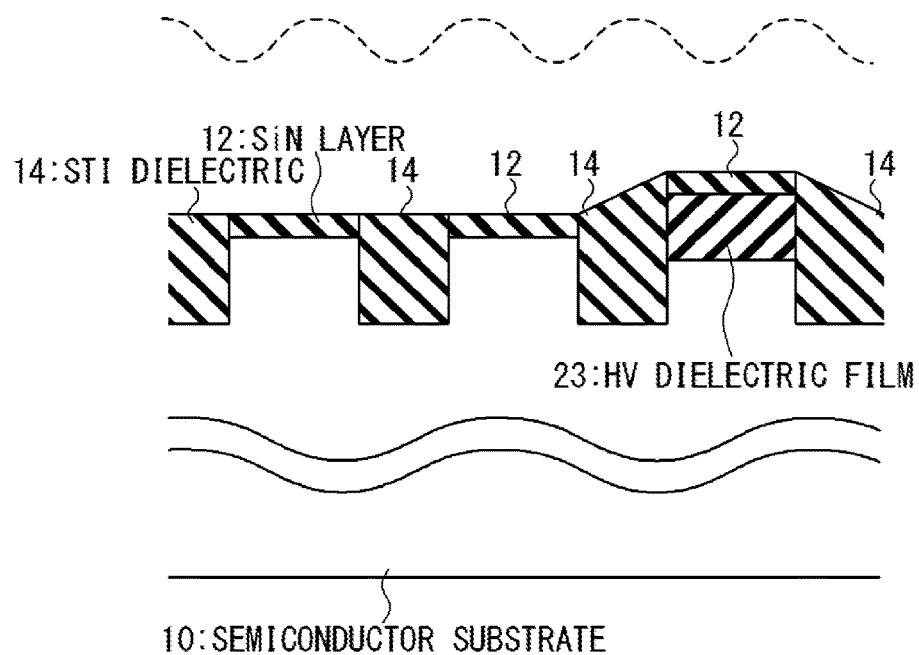

SiN (silicon nitride) layers 12 are then formed so that the SiN layers 12 cover the main surface of the semiconductor substrate 10 other than the trenches 11 and an HDP film 13 is then formed to cover the whole of the main surface of the semiconductor substrate 10 through an HDP (high-density plasma) process. A CMP process is then performed against the HDP film 13 to form STI dielectrics 14. FIG. 7IJ is a section view illustrating the state of the semiconductor substrate 10 before the CMP process and FIG. 7E is a section view illustrating the state after the CMP process. In the CMP process at step S302, the SiN layers 12 are used as stopper films and the semiconductor substrate 10 is polished until the top surfaces of the SiN layers 12 are exposed.

Figure 7F:
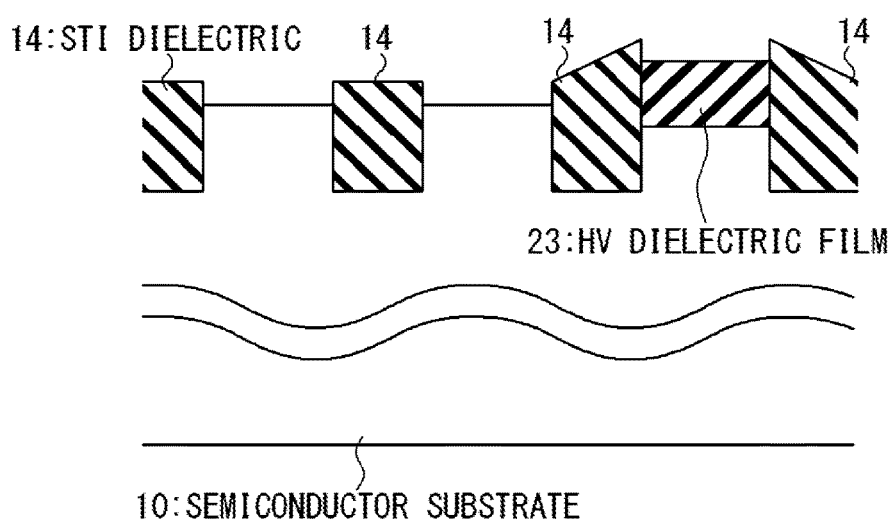

This is followed by removing the SiN layers 12. FIG. 7F is a section view illustrating the state after the SiN layers 12 are removed.

Figure 7G:
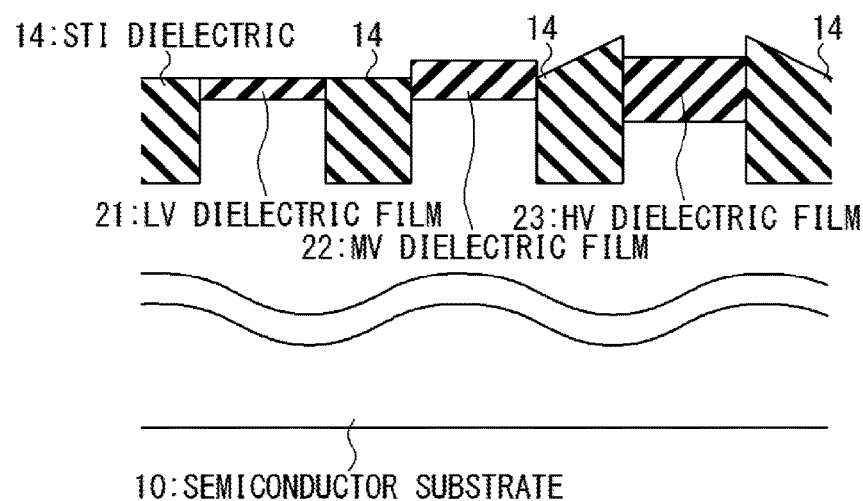

Subsequently, MV dielectric films 22 (one illustrated) are formed at step S303, and LV dielectric films 21 (one illustrated) are formed at step S304. It should be noted that MV gate dielectric films 32 and MV dummy dielectric films 42, which are collectively referred to as MV dielectric films 22, are formed at the same time at step S303. Similarly, LV gate dielectric films 31 and LV dummy dielectric films 41, which are collectively referred to as LV dielectric films 21, are formed at the same time at step S304. FIG. 7G is a section view illustrating the state of the semiconductor substrate 10 after the LV dielectric films 21 and MP dielectric films 22 are formed.

Figure 7H:
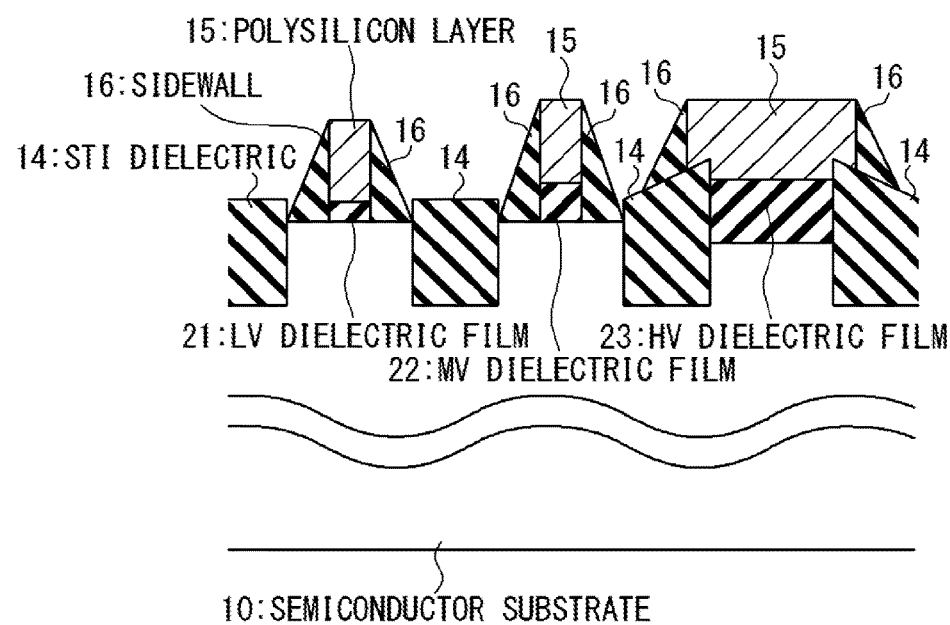

Subsequently, gate structures are formed at step S305. The gate structures include polysilicon layers 15 and sidewalls 16 which surround the polysilicon layers 15. The polysilicon layers 15 are formed on the LV dielectric films 21, MV dielectric films 22 and HV dielectric films 23, which are used as gate dielectrics. FIG. 7H is a section diagram illustrating the state of the semiconductor substrate 10 after the polysilicon layers 15 and the sidewalls 16 are formed.

At step S306, an interlayer dielectric 17 is then deposited to cover the whole of the main surface of the semiconductor substrate 10. FIG. 7I is a section view illustrating the state of the semiconductor substrate 10 after the deposition of the interlayer dielectric 17.

Figure 7J:
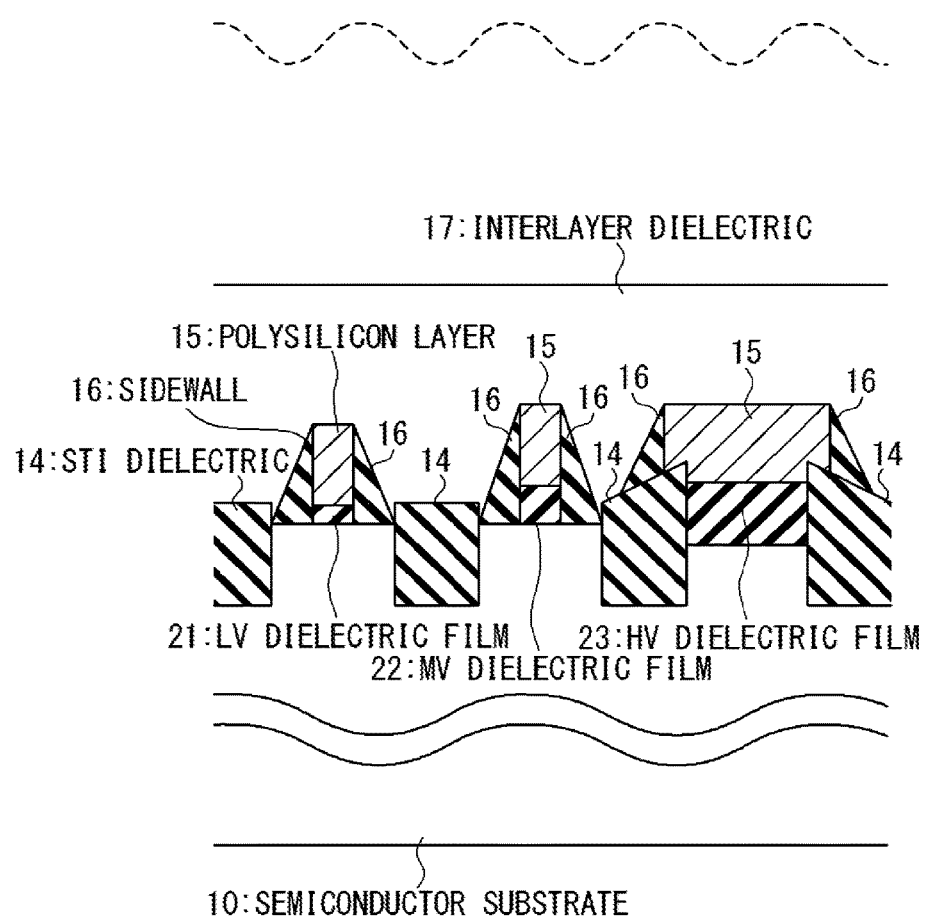

This is followed by performing a CMP process at step S307. FIG. 7J is a section view illustrating the state of the semiconductor substrate 10 after the CMP process is performed against the interlayer dielectric 17.

As thus described, all of the first to third semiconductor device manufacturing processes include two CMP processes. The first CMP process is performed in the formation of the STI structure, and the second CMP process is performed after the deposition of the interlayer dielectric 17. In embodiments described in the following, the film flatness is improved in each of these two CMP processes.

(First Embodiment)

A first embodiment is directed to improve the film flatness in the first CMP process (the CMP process in forming the STI structure). In a conventional semiconductor device manufacturing process, one type of dummy patterns, typically, LV dummy dielectric films are used for a CMP process. In this case, when multiple types of gate dielectric films with different heights are formed, step structures are generated between the gate electric films and the dummy dielectric films in the CMP process. Such step structures are generated, for instance, in the second semiconductor device manufacturing process illustrated in FIGS. 4 and 5A to 5I and in the third semiconductor device manufacturing process illustrated in FIGS. 6 and 7A to 7J. This is because one or more types of gate dielectric films are formed before the CMP process in the STI formation.

This type of step structure is not generated in the first semiconductor device manufacturing process illustrated in FIGS. 2 and 3A to 3I. This is because the gate dielectric films are formed after the CMP process in the STI formation in the first semiconductor device manufacturing process.

Figure 8A:
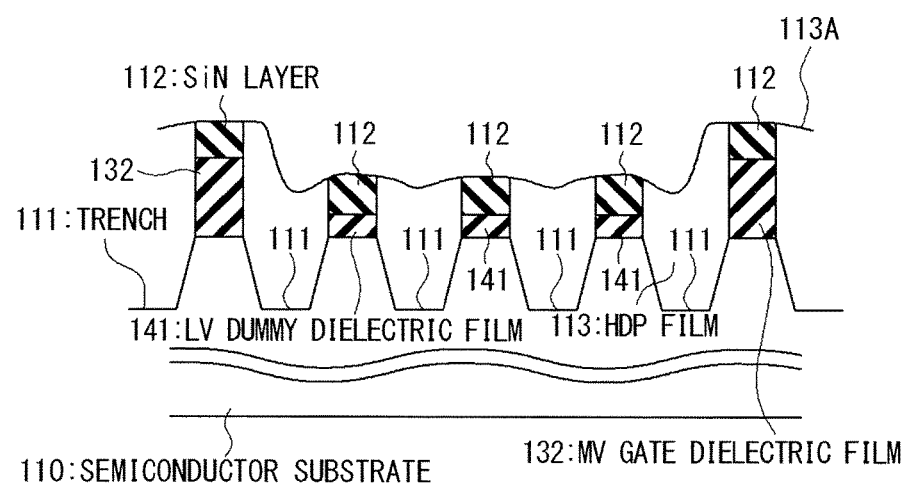
FIG. 8A is a section view illustrating the state after a CMP process is performed after formation of STI trenches in a conventional semiconductor device manufacturing process.
Figure 8B:
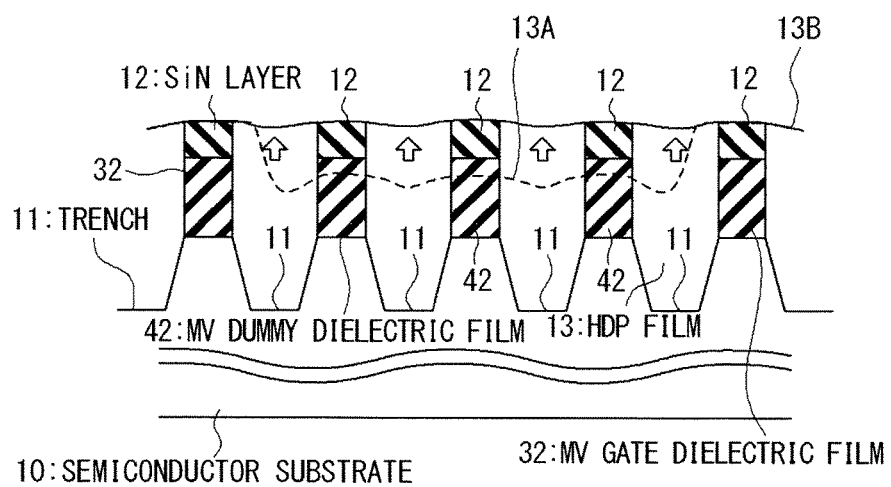
FIG. 8B is a section view illustrating the state after a CMP process is performed after formation of STI trenches in a semiconductor device manufacturing process of one embodiment.

FIG. 8A is a section view illustrating one example of the structure of a semiconductor device manufactured by a conventional semiconductor device manufacturing process, after the CMP process is performed in the STI structure formation. FIG. 8B is a section view illustrating one example of the structure of a semiconductor device manufactured by a semiconductor device manufacturing process of this embodiment, after the CMP process is performed in the STI structure formation.

In the semiconductor device illustrated in FIG. 8A, MV gate dielectric films 132, LV dummy dielectric films 141, SiN layers 112, trenches 111 and HDP films 113 are formed on the semiconductor substrate 110. In the structure illustrated in FIG. 8A, three LV dummy dielectric films 141 are located between two MV gate dielectric films 132. The trenches 111 are formed around the LV dummy dielectric films 141 and the MV gate dielectric films 132. The SiN layers 112 are formed on the top surfaces of the LV dummy dielectric films 141 and the MV gate dielectric films 132. The CMP process is stopped at the top surfaces of the SiN layers 112 and the surfaces 113A of the HDP films 113 are curved to connect the top surfaces of the SiN layers 112.

Referring to FIG. 8A, the heights of the surfaces 113A of the HDP films 113 are higher near the MV gate dielectric films 132 and lower near the LV dummy dielectric films 141. This implies that the surfaces 113A of the HDP films 113 include step structures. Furthermore, over-polishing occurs in the CMP process and this undesirably deteriorates the film flatness of the semiconductor device.

In the semiconductor device illustrated in FIG. 8B, on the other hand, MV gate dielectric films 32, MV dummy dielectric films 42, SiN layers 12, trenches 11 and HDP films 13 are formed on the semiconductor substrate 10. Also in the structure illustrated in FIG. 8B, three MV dummy dielectric films 42 are located between two MV gate dielectric films 32. The trenches 11 are formed around the MV dummy dielectric films 42 and the MV gate dielectric films 32. The SiN layers 12 are formed on the top surfaces of the MV dummy dielectric films 42 and the MV gate dielectric films 32. The CMP process is stopped at the top surfaces of the SiN layers 12 and the surfaces 13A of the HDP films 13 are curved to connect the top surfaces of the SiN layers 12.

Referring to FIG. 8B, the surfaces 13A of the HDP films 13 are relatively flat, since the heights of the MV dummy dielectric films 42 are close to those of the nearby structures, reducing the step structures. This effectively suppresses over-polishing in the CMP process.

In this embodiment, as illustrated in FIG. 8B, the film flatness of the CMP process is effectively improved by suitably selecting the height of a dummy dielectric film in accordance with the height of the nearby structure.

Subsequently, a description is given of a preferred selection of the height of a dummy dielectric film in a region in which gate dielectric films with different heights are arranged.

Figure 9A:
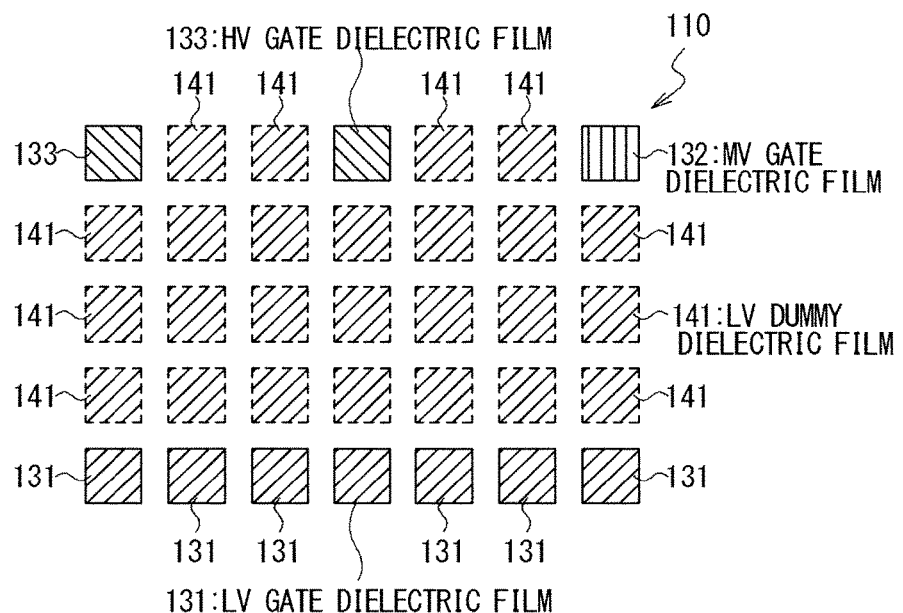
FIG. 9A is a plan view illustrating an arrangement example of a region in which gate dielectric films having different heights, and dummy dielectric films commonly having a specific height are placed on the main surface of a semiconductor substrate in a conventional semiconductor device manufacturing process.

FIG. 9A is a plan view illustrating an arrangement example of a region in which gate dielectric films 131, 132 and 133 having different heights, and dummy dielectric films 141 commonly having a specific height are placed on the main surface of the semiconductor substrate 110 in a conventional semiconductor device manufacturing process.

Illustrated in FIG. 9A are LV gate dielectric films 131, an MV gate dielectric film 132, HV gate dielectric films 133 and LV dummy dielectric films 141 placed on the main surface of the semiconductor substrate 110. It should be noted that LV dummy dielectric films 141 are placed in all of the following regions: (i) a region between the LV gate dielectric films 131 and the MV gate dielectric film 132, (ii) a region between the LV gate dielectric films 131 and the HV gate dielectric films 133 and (iii) a region between the MV gate dielectric film 132 and the HV gate dielectric films 133. The arrangement in which dielectric films with different are thus arranged on the semiconductor substrate 110 undesirably generates step structures which remain even after the CMP process, undesirably deteriorating the film flatness.

Figure 9B:
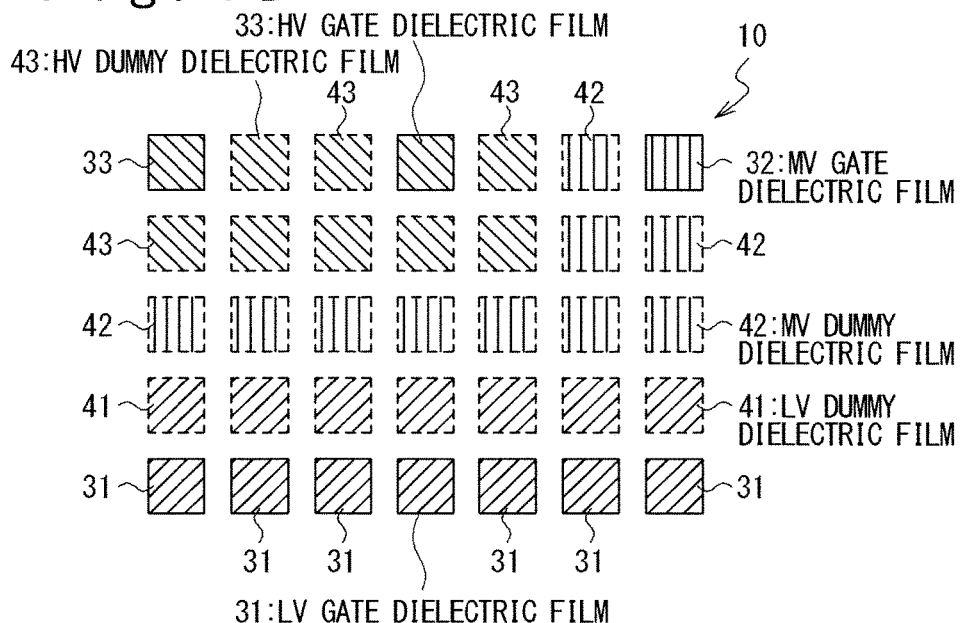
FIG. 9B is a plan view illustrating an arrangement example of a region in which gate dielectric films and dummy electric films having different heights are placed on the main surface of the semiconductor substrate in a semiconductor device manufacturing process of this embodiment.

FIG. 9B is a plan view illustrating an arrangement example of a region in which gate dielectric films and dummy electric films having different heights are placed on the main surface of the semiconductor substrate 10 in the semiconductor device manufacturing process of this embodiment.

Illustrated in FIG. 9B are LV gate dielectric films 31, an MV gate dielectric film 32, HV gate dielectric films 33, LV dummy dielectric films 41, MV dummy dielectric films 42 and HV dummy dielectric film 43 placed on the main surface of the semiconductor substrate 10. The LV dummy dielectric films 41, MV dummy dielectric films 42 and HV dummy dielectric film 43 are arranged to satisfy conditions described in the following:

Condition 1:

In a region between two gate dielectric films having the same height, a dummy dielectric film having the same height as the two gate dielectric films is placed. In the example illustrated in FIG. 9B, two HV dummy dielectric films 43, which have the same height as two HV gate dielectric films 33, are placed in the region between two HV gate dielectric films 33.

Condition 2:

In a region between two gate dielectric films having different heights, one or more of (i) a dummy dielectric film having the same height as one of the two gate dielectric films, (ii) a dummy dielectric film having the same height as the other of the two gate dielectric films and (iii) a dummy dielectric film having a height between those of the two gate dielectric films are placed. In the example illustrated in FIG. 9B, an HV dummy dielectric film 43 and an MV dummy dielectric film 42 are placed in the region between the MV gate dielectric film 32 and the HV gate dielectric film 33 closest to the MV gate dielectric film 32. Also, two MV dummy dielectric films 42 and an LV dummy dielectric film 41 are placed in a region between the MV gate dielectric film 32 and the LV gate dielectric film 31 closest to the MV gate dielectric film 32. Furthermore, HV dummy dielectric films 43, MV dummy dielectric films 42 and LV dummy dielectric films 41 are placed in the region between the HV gate dielectric films 33 and the LV gate dielectric films 31.

Condition 3:

In the case when multiple dummy dielectric films are arranged between two gate dielectric films having different heights, a dummy dielectric film having the same height as one of the two gate dielectric films is placed closer to the one of the two gate dielectric films than to the other, and a dummy dielectric film having the same height as the other of the two gate dielectric films is placed closer to the other than to the one. In the example illustrated in FIG. 9B, with respect to an HV dummy dielectric film 43 and an MV dummy dielectric film 42 placed between the MV gate dielectric film 32 and the HV gate dielectric film 33 closest thereto, the HV dummy dielectric film 43 is placed near the HV gate dielectric film 33 and the MV dummy dielectric film 42 is placed near the MV gate dielectric film 32. Also, with respect to two MV dummy dielectric films 42 and an LV dummy dielectric film 41 placed between the MV gate dielectric film 32 and the LV gate dielectric film 31 closest thereto, the two MV dummy dielectric films 42 are placed near the MV gate dielectric film 32 and the LV dummy dielectric film 41 is placed near the LV gate dielectric film 31. Further, with respect to HV dummy dielectric films 43 and LV dummy dielectric films 41 placed between the HV gate dielectric films 33 and the LV gate dielectric films 31, the HV dummy dielectric films 43 are placed near the HV gate dielectric films 33 and the LV dummy dielectric films 41 are placed near the LV gate dielectric films 31. As for the region between the HV gate dielectric films 33 and the LV gate dielectric films 31, MV dummy dielectric films 42, which have a height between those of the HV gate dielectric films 33 and the LV gate dielectric films 31, may be placed between the HV dummy dielectric films 43 and the LV dummy dielectric films 41.

As thus described, the film flatness of the CMP process in the STI formation can be improved by placing dummy dielectric films having different heights between gate dielectric films having the corresponding heights, so that the above-described conditions are satisfied. It would be understood to a person skilled in the art that placement of dummy dielectric films having different heights to satisfy the above-described conditions can be achieved through an automatic placement technique.

(Second Embodiment)

The second embodiment is directed to improvement of the film flatness of the second CMP process. As described above, one type of dummy patterns, typically, LV dummy dielectric films are used for a CMP process in a conventional semiconductor device manufacturing process.

In this case, when multiple types of gate dielectric films with different heights are formed, step structures are generated between the gate electric films and the dummy dielectric films in the deposition of the interlayer dielectric. Especially, when a region in which dummy patterns having a height lower than those of transistors arranged around the dummy patterns are placed is wide, the height of the surface of the interlayer dielectric in this region becomes lower because of the lower height of the dummy patterns, even when the deposition thickness of the interlayer dielectric is uniform.

Figure 10:
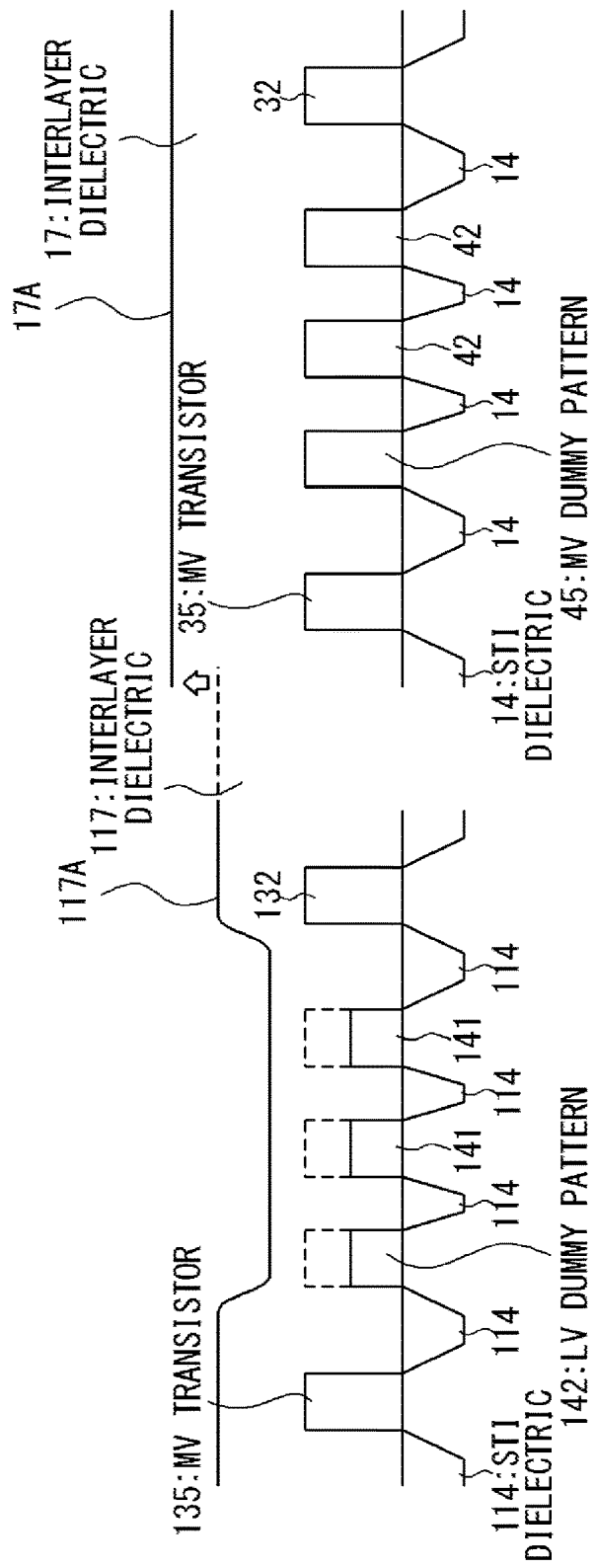
FIG. 10 is a section view illustrating an example of the influence of the heights of the dummy patterns on the flatness of the surface of the interlayer dielectric.

FIG. 10 is a section view illustrating an example of the influence of the heights of dummy patterns on the flatness of the surface of the interlayer dielectric. The left section of FIG. 10 illustrates that the surface 117A of the interlayer dielectric 117 partially becomes lower, due to the fact that the height of the LV dummy patterns 142 placed in a region in which the MV transistors 135 are placed is lower than that of the MV transistors 135, in the conventional semiconductor device manufacturing process. The right section of FIG. 10 illustrates that the influence on the surface 17B of the interlayer dielectric 17 is suppressed by placing MV dummy patterns 45, which have the same height as MV transistors 35, in a region in which MV transistors 35 are placed in the semiconductor device manufacturing process of this embodiment.

As understood from FIG. 10, the heights of dummy patterns influence on the height of the surface of the interlayer dielectric 17. As discussed below, a similar influence is caused by the distributions of the data ratios of transistors and dummy patterns.

A data ratio is defined by the ratio of the area occupied by a specific type of structure components in a specific region of the main surface of the semiconductor substrate 10. The ratio of the area occupied by transistors in a specific region is referred to as the data ratio of transistors, hereinafter. Also, the ratio of the area occupied by dummy patterns in a specific region is referred to as the data ratio of dummy patterns.

Figure 11A:
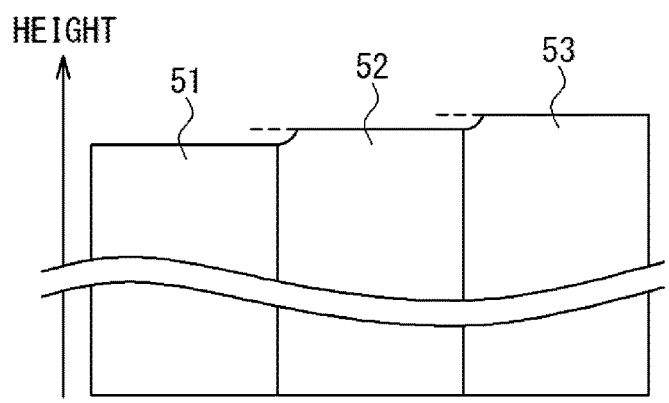
FIG. 11A is a section view illustrating variations in the height of the surface of an interlayer dielectric formed in a plurality of regions in which structure components having the same height are placed with different data ratios.

FIG. 11A is a section view illustrating variations in the height of the surface of the interlayer dielectric formed in a plurality of regions in which structure components having the same height are placed with different data ratios. Illustrated in FIG. 11A are an MV low-data-ratio area 51, an MV middle-data ratio area 52 and an MV high-data-ratio area 53. The MV low-data-ratio area 51 is an area in which MV transistors and MV dummy patterns are mainly formed with a low data ratio. The MV high-data-ratio area 53 is an area in which MV transistors and MV dummy patterns are mainly formed with a high data ratio. The MV middle-data-ratio area 52 is an area in which MV transistors and MV dummy patterns are mainly formed with a middle data ratio. In this case, the height of the surface of the interlayer dielectric 17 in these areas is as follows: The height of the surface of the interlayer dielectric 17 in the MV low-data-ratio area 51 is lower than that in the MV middle-data-ratio area 52, and the height of the surface of the interlayer dielectric 17 in the MV high-data-ratio area 53 is higher than that in the MV middle-data-ratio area 52. This implies that variations in the data ratio influence the height of the surface of the interlayer dielectric 17, even when other conditions are same.

Figure 11B:
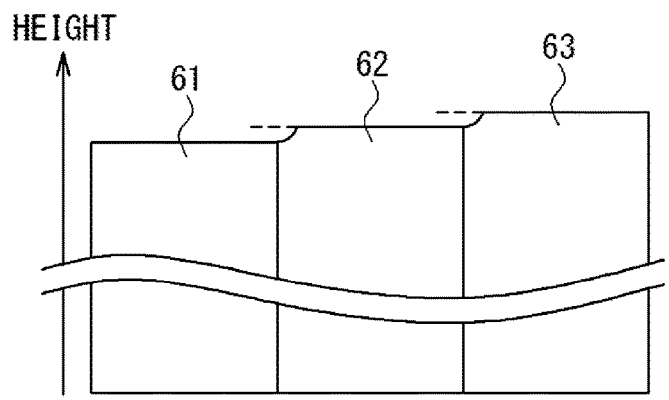
FIG. 11B is a section view illustrating variations in the height of the surface of an interlayer dielectric formed in a plurality of regions in which structure components having different heights are placed with the same data ratio.

FIG. 11B is a section view illustrating variations in the height of the surface of the interlayer dielectric formed in a plurality of regions in which structure components having different heights are placed with the same data ratio. Illustrated in FIG. 11B are an LV middle-data-ratio area 61, an MV middle-data ratio area 62 and an HV middle-data-ratio area 63. The LV middle-data-ratio area 61 is an area in which LV transistors and LV dummy patterns are mainly formed with a middle data ratio. The MV middle-data-ratio area 62 is an area in which MV transistors and MV dummy patterns are mainly formed with a middle data ratio. The HV middle-data-ratio area 63 is an area in which HV transistors and HV dummy patterns are mainly formed with a middle data ratio. In this case, the height of the surface of the interlayer dielectric 17 in these areas is as follows: The height of the surface of the interlayer dielectric 17 in the LV middle-data-ratio area 61 is lower than that in the MV middle-data-ratio area 62, and the height of the surface of the interlayer dielectric 17 in the HV middle-data-ratio area 63 is higher than that in the MV middle-data-ratio area 62. This implies that, as also illustrated in FIG. 10, variations in the heights of the gate dielectric films and the dummy dielectric films influence the height of the surface of the interlayer dielectric 17, even when other conditions are same.

In view of the above, it would be understood that the interlayer dielectric 17 can be flattened over the semiconductor substrate 10 by keeping the below-defined value S constant in any regions in which gate dielectric films are formed.

$$S=H_L\times(D_L+D_{LD})+H_M\times(D_M+D_{MD})+H_H\times(D_H+D_{HD})$$

In this expression, $H_L$ is the height of LV transistors and LV dummy patterns, $D_L$ is the data ratio of LV transistors in the region of interest, and $D_{LD}$ is the data ratio of LV dummy patterns in the region of interest. $H_M$ is the height of MV transistors and MV dummy patterns, $D_M$ is the data ratio of MV transistors in the region of interest, and $D_{MD}$ is the data ratio of MV dummy patterns in the region of interest. $H_H$ is the height of HV transistors and HV dummy patterns, $D_H$ is the data ratio of HV transistors in the region of interest, and $D_{HD}$ is the data ratio of HV dummy patterns in the region of interest.

In a preferred embodiment, respective types of dummy patterns are placed with the data ratios of the respective types of dummy patterns adjusted properly, so that the above-defined value S is kept constant over the whole of the main surface of the semiconductor substrate 10.

Although it is desirable that the value S is completely kept constant over the whole of the main surface of the semiconductor substrate 10, it may be practically difficult to completely satisfy this requirement, since the three types of heights $H_L$, $H_M$ and $H_H$ are discretely defined. In an actual implementation, it would be practical that the value S is kept in a range having a certain width. It would be therefore preferable that the value S is in the range thus defined.

Figure 12A:
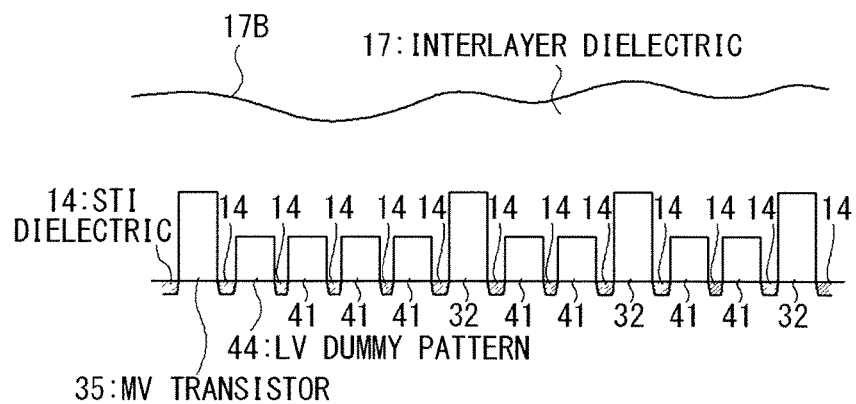
FIG. 12A is a section view illustrating an example of the state of the surface of an interlayer dielectric in the case when the data ratios of dummy patterns having different heights are not adjusted, that is, the case when only one type of dummy patterns are used, as in a conventional technique.
Figure 12B:
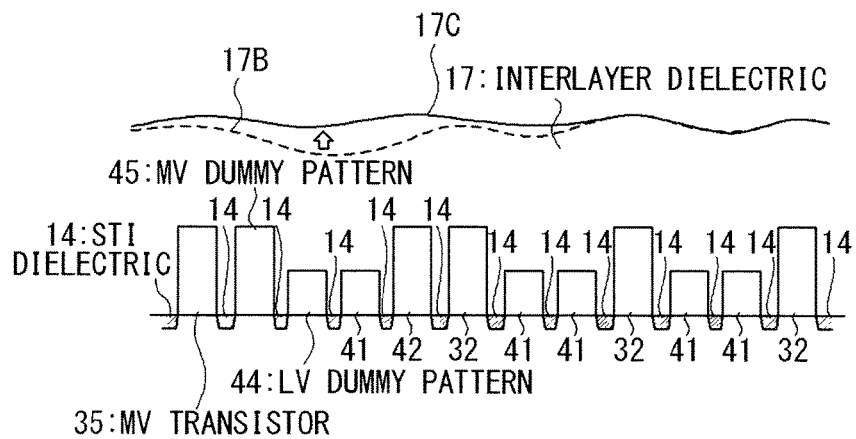
FIG. 12B is a section view illustrating an example of the state of the surface of an interlayer dielectric in the case when the data ratios of dummy patterns having different heights are properly adjusted.

FIG. 12A is a section view illustrating an example of the state of the surface 17B of the interlayer dielectric 17 in the case when the data ratios of dummy patterns having different heights are not adjusted, that is, the case when only one type of dummy patterns are used, as in a conventional technique. FIG. 12B is a section view illustrating an example of the state of the surface 17C of the interlayer dielectric 17 in the case when the data ratios of dummy patterns having different heights are properly adjusted.

In each of the structures illustrated in FIGS. 12A and 12B, the data ratio of the MV transistors 35 is relatively low in the left region, and relatively high in the right region. The structure illustrated in FIG. 12B is modified from that illustrated in FIG. 12A so that some of the LV dummy patterns 44 placed in the left region are replaced with MV dummy patterns 45. This effectively improves the flatness of the surface 17C of the interlayer dielectric 17 as illustrated in FIG. 12B, which is subjected to the above-described modification, compared with the surface 17B of the interlayer dielectric 17 illustrated in FIG. 12A, which is not subjected to the above-described modification.

Although the film flatness is improved by adjusting the heights of dummy patterns in the structure illustrated in FIG. 12B, it would be understood that a similar effect is obtained by adjusting the data ratio of dummy patterns.

Placement and adjustment of dummy dielectric films or dummy patterns to improve the film flatness in the first and second CMP processes may be automatically implemented on the basis of the layout of respective types of structure components by a layout tool configured to design the configuration of a semiconductor device. Such layout tool may be implemented as a specific software program to be executed on a commonly-used computer.

Figure 13:
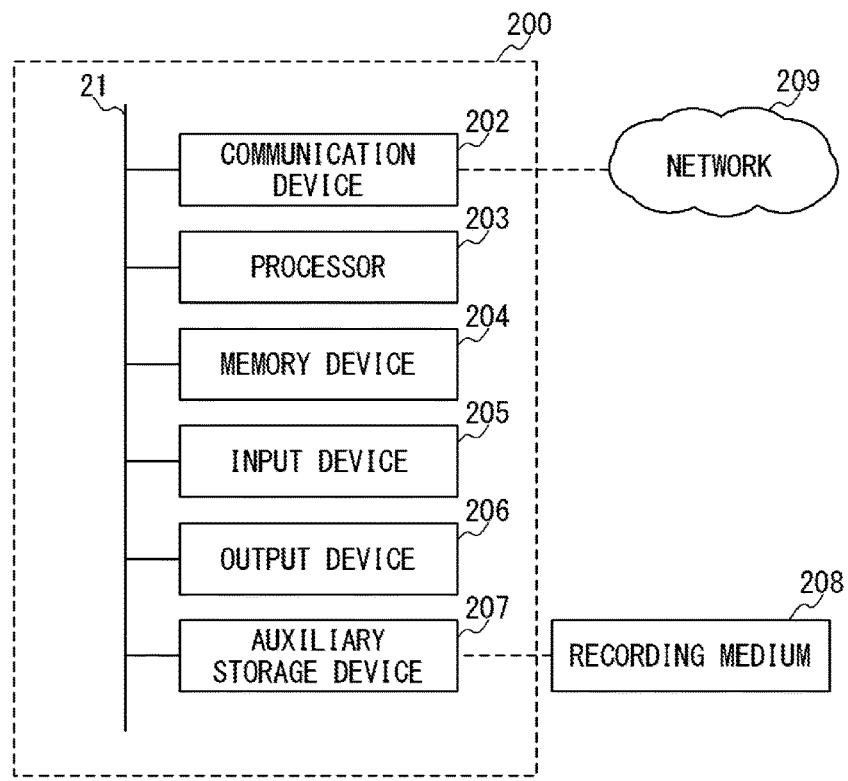
FIG. 13 is a block diagram illustrating an example of a computer system onto which a layout tool is installed.

FIG. 13 is a block diagram illustrating an example of a computer system 200 onto which a layout tool is installed. The computer system 200 includes a bus 201, a communication device 202, a processor 203, a memory device 204, an input device 205, an output device 206 and an auxiliary storage device 207. The communication device 202, the processor 203, the memory device 204, the input device 205, the output device 206 and the auxiliary storage device 207 are connected via the bus 201 and communicable with one another. The communication device 202 is also connected to a given network 209. The auxiliary storage device 207 is configured to read desired data from a recording medium 208. The recording medium 208 may be a non-transitory recording medium which is not rewritable or erasable.

Placement of dummy patterns in the semiconductor device manufacturing procedure of this embodiment may be implemented by storing a layout tool including a dummy pattern placement program in the memory device 204 and executing the layout tool on the processor 203. The dummy pattern placement program may be read out from the recording medium 208 via the auxiliary storage device 207. It would be preferable that the layout tool read outs placement data of transistors or the gate dielectric films thereof. The placement data of transistors or the gate dielectric films may be input from the input device 205, or received from a different computer via the communication device 202 and the network 209. The placement data of the dummy patterns or dummy dielectric films obtained as a calculation result of the layout tool may be output from the output device 206 or transmitted to a different computer via the communication device 202 and the network 209.

In the above description, it is assumed that the height of structure components is lowest for LV, highest for HV and middle for MV. It should be noted however that the height of a structure component does not necessarily correspond to the thickness of the structure component. In other words, the order of the heights of structure components may be exchanged. This is because, for example, the bottom surface of an HV dielectric film 23 may be positioned lower than the bottom faces of an LV dielectric film 21 and an MV dielectric film 22. When the order of the heights is exchanged, "LV" structure components, "MV" structure components and "HV" structure components are to be accordingly exchanged, since the height of a structure component is defined as the position of the top surface of the structure component in the thickness direction of the semiconductor substrate, in the above-described embodiments.

Although the above-described embodiments are directed to the case when transistors (or gate dielectric films) and dummy patterns (or dummy dielectric films) each have one selected from three allowed heights, the number of the allowed heights may be two or four or more. Also in these cases, the film flatness of the CMP process can be effectively improved.

Although embodiments of the present disclosure have been specifically described in the above, it would understood that the present disclosure is not limited to the above-described embodiments, which may be modified and changed without departing from the scope of the disclosure. It should be also noted that the features described in the respective embodiments may be freely combined as long as no technical inconsistency occurs.

What is claimed is:

1. A semiconductor device, comprising:
   a substrate defining a surface;
   a first structure component comprising a first transistor and having a first height relative to the surface, wherein a top surface of a gate electrode of the first transistor defines the first height;
   a first dummy pattern having the first height;
   a second structure component comprising a second transistor and having a second height relative to the surface and less than the first height, wherein a top surface of a gate electrode of the second transistor defines the second height; and
   a second dummy pattern having the second height,
   wherein at least one of the first dummy pattern and the second dummy pattern is arranged between the first structure component and the second structure component.

2. The semiconductor device according to claim 1,
   wherein a first gate dielectric film of the gate electrode of the first transistor defines the top surface defining the first height,
   wherein a second gate dielectric film of the gate electrode of the second transistor defines the top surface defining the second height,
   wherein the first dummy pattern includes a first dummy dielectric film having the first height,
   wherein the second dummy pattern includes a second dummy dielectric film having the second height, and
   wherein the first dummy dielectric film and the second dummy dielectric film are arranged between the first gate dielectric film and the second gate dielectric film.

3. The semiconductor device according to claim 2, wherein the first dummy dielectric film is arranged closer to the first gate dielectric film than to the second gate dielectric film, and
   wherein the second dummy dielectric film is arranged closer to the second gate dielectric film than to the first gate dielectric film.

4. The semiconductor device according to claim 2, further comprising:
   a third dummy pattern including a third dummy dielectric film defining a third height relative to the surface that is less than the first height and greater than the second height,
   wherein the third dummy dielectric film is arranged between the first gate dielectric film and the second gate dielectric film.

5. A semiconductor device manufacturing method, comprising:
   determining a placement of a first structure component having a first height relative to a surface of a semiconductor substrate, a second structure component having a second height relative to the surface and less than the first height, a first dummy pattern having the first height, and a second dummy pattern having the second height, wherein the first structure component comprises a first transistor, wherein a top surface of a gate electrode of the first transistor defines the first height, wherein the second structure component comprises a second transistor, wherein a top surface of a gate electrode of the second transistor defines the second height;
   forming the first structure component and the first dummy pattern at the surface of the semiconductor substrate;
   forming the second structure component and the second dummy pattern at the surface of the semiconductor substrate, wherein at least one of the first dummy pattern and the second dummy pattern is arranged between the first structure component and the second structure component; and
   forming a film having a thickness greater than the first height to thereby cover the surface, the first structure component, the first dummy pattern, the second structure component, and the second dummy pattern.

6. The semiconductor device manufacturing method according to claim 5, wherein a first gate dielectric film of the gate electrode of the first transistor defines the top surface defining the first height,
   wherein a second gate dielectric film of the gate electrode of the second transistor defines the top surface defining the second height,
   wherein the first dummy pattern includes a first dummy dielectric film having the first height,
   wherein the second dummy pattern includes a second dummy dielectric film having the second height, and
   wherein, in the placement, the first dummy dielectric film and the second dummy dielectric film are arranged between the first gate dielectric film and the second gate dielectric film.

7. The semiconductor device manufacturing method according to claim 6,
   wherein, in the placement, the first dummy dielectric film is arranged closer to the first gate dielectric film than to the second gate dielectric film, and
   wherein, in the placement, the second dummy dielectric film is arranged closer to the second gate dielectric film than to the first gate dielectric film.

8. The semiconductor device manufacturing method according to claim 6, further comprising:
   determining a placement of a third dummy pattern including a third dummy dielectric file defining a third height relative to the surface that is less than the first height and greater than the second height,
   wherein, in the placement, the third dummy dielectric file is arranged between the first gate dielectric film and the second gate dielectric film.

9. A semiconductor device comprising:
   a substrate defining a surface, the surface divided into a plurality of regions;
   a plurality of structure components each having a respective height relative to the surface that is selected from a plurality of predefined first to n-th height values; and
   a plurality of dummy patterns each having a respective height relative to the surface that is selected from the plurality of predefined first to n-th height values,
   wherein each region of the plurality of regions includes a respective one or more structure components of the plurality of structure components or a respective one or more dummy patterns of the plurality of dummy patterns,
   wherein the plurality of structure components and the plurality of dummy patterns are arranged such that, a respective height distribution value (S) corresponding to each region is at least within a predefined range, the height distribution value representing a height distribution of the respective one or more structure components or the respective one or more dummy patterns within the corresponding region.

10. The semiconductor device of claim 9, wherein the height distribution values corresponding to the plurality of regions are a substantially constant value.

11. The semiconductor device of claim 9, wherein each height distribution value equals a sum of respective first to n-th product terms, wherein, for the corresponding region and for each value of an integer i from one to n, the i-th product term of the respective first to nth product terms equals the i-th height value multiplied by a sum of a data ratio of structure components of the respective one or more structure components having the i-th height value and a data ratio of dummy patterns of the respective one or more dummy patterns having the i-th height value, and wherein each data ratio represents a proportion of an area occupied by the structure components or the dummy patterns of a corresponding height value to the total area of the region.

12. The semiconductor device of claim 9, wherein each structure component of the plurality of structure components comprises a respective gate dielectric film having a thickness that defines the respective height of the structure component.

13. The semiconductor device of claim 12, wherein the gate dielectric film is selected from a plurality of predefined gate dielectric films having different thicknesses based on a corresponding operating voltage.

14. A semiconductor device manufacturing method, comprising:

determining a placement of a plurality of structure components and a plurality of dummy patterns at a surface of a semiconductor substrate, each of the plurality of structure components and the plurality of dummy patterns having a respective height relative to the surface that is selected from a plurality of predefined first to n-th height values; and forming the plurality of structure components and the plurality of dummy patterns at the surface of the semiconductor substrate, wherein the surface is divided into a plurality of regions, wherein each region of the plurality of regions includes a respective one or more structure components of the plurality of structure components or a respective one or more dummy patterns of the plurality of dummy patterns, wherein the plurality of structure components and the plurality of dummy patterns are arranged such that, a respective height distribution value (S) corresponding to each region remains at least within a predefined range, the height distribution value representing a height distribution of the respective one or more structure components or the respective one or more dummy patterns within the corresponding region.

15. The semiconductor device manufacturing method of claim 14, wherein the height distribution values corresponding to the plurality of regions are a substantially constant value.

16. The semiconductor device manufacturing method of claim 14, wherein each height distribution value equals a sum of respective first to n-th product terms, wherein, for the corresponding region and for each value of an integer i from one to n, the i-th product term of the respective first to n-th product terms equals the i-th height value multiplied by a sum of a data ratio of structure components of the respective one or more structure components having the i-th height value and a data ratio of dummy patterns of the respective one or more dummy patterns having the i-th height value, and wherein each data ratio represents a proportion of an area occupied by the structure components or the dummy patterns of a corresponding height value to the total area of the region.

17. The semiconductor device manufacturing method of claim 14, wherein each structure component of the plurality of structure components comprises a respective gate dielectric film having a thickness that defines the respective height of the structure component.

18. The semiconductor device manufacturing method of claim 17, wherein the gate dielectric film is selected from a plurality of predefined gate dielectric films having different thicknesses based on a corresponding operating voltage.

19. A computer program product comprising a non-transitory computer-readable storage medium containing code which, when executed by one or more processors, performs an operation for determining a placement of multiple component types at a surface of a semiconductor device, the operation comprising:

dividing the surface into a plurality of regions;

distributing a plurality of structure components and a plurality of dummy patterns among the plurality of regions, each of the plurality of structure components and the plurality of dummy patterns having a respective height relative to the surface that is selected from a plurality of predefined first to n-th height values, wherein each region of the plurality of regions includes a respective one or more structure components of the plurality of structure components or a respective one or more dummy patterns of the plurality of dummy patterns;

calculating, for each region of the plurality of regions, a respective height distribution value (S) representing a height distribution of the respective one or more structure components or the respective one or more dummy patterns within the corresponding region; and determining whether each of the height distribution values corresponding to the plurality of regions is within at least a predefined range.

20. The computer program product of claim 19, wherein calculating, for each region of the plurality of regions, a height distribution value comprises:

for each value of an integer i from one to n:
determining a first data ratio of structure components of the respective one or more structure components having the i-th height value;
determining a second data ratio of dummy patterns of the respective one or more dummy patterns having the i-th height value; and
multiplying the i-th height value by a sum of the first and second data ratios to produce an i-th product term; and summing the first through n-th product terms to produce the height distribution value.

21. The semiconductor device manufacturing method of claim 5, further comprising:

performing a chemical mechanical polishing (CMP) process on the film.

* * * * *